United States Patent
O'Donnell et al.

(10) Patent No.: US 7,348,906 B2
(45) Date of Patent: Mar. 25, 2008

(54) INL CURVE CORRECTION IN A PIPELINE ADC

(75) Inventors: John J. O'Donnell, Quin (IE); Colin Gerard Lyden, Baltimore (IE); David G. Nairn, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/224,432

(22) Filed: Sep. 12, 2005

(65) Prior Publication Data

US 2006/0114144 A1 Jun. 1, 2006

Related U.S. Application Data

(60) Provisional application No. 60/685,155, filed on May 27, 2005, provisional application No. 60/609,049, filed on Sep. 10, 2004.

(51) Int. Cl.
*H03M 1/20* (2006.01)
(52) U.S. Cl. ................. 341/131; 341/161; 341/155
(58) Field of Classification Search .......... 341/161, 341/143, 155, 120, 117, 118, 131
See application file for complete search history.

(56) References Cited

U.S. PATENT DOCUMENTS

| | | | | | |
|---|---|---|---|---|---|
| 5,982,313 | A | * | 11/1999 | Brooks et al. | 341/143 |
| 6,028,546 | A | * | 2/2000 | Signell et al. | 341/161 |
| 6,271,782 | B1 | * | 8/2001 | Steensgaard-Madsen | 341/143 |
| 6,369,744 | B1 | * | 4/2002 | Chuang | 341/161 |
| 6,462,685 | B1 | * | 10/2002 | Korkala | 341/131 |
| 6,784,814 | B1 | * | 8/2004 | Nair et al. | 341/118 |
| 2005/0078026 | A1 | * | 4/2005 | Cai | 341/162 |

* cited by examiner

*Primary Examiner*—Jean Bruner Jeanglaude
(74) *Attorney, Agent, or Firm*—Wolf, Greenfield & Sacks, P.C.

(57) ABSTRACT

The present invention relates to a method and system for reducing integral non linearity errors in a pipeline Analog to Digital Converter (ADC). The invention provides in a first embodiment a method comprising the steps of: adding an analog dither signal to the analog input signal of a pipeline Analog to Digital Converter, and converting the analog input signal to a digital output signal by means of the pipeline Analog to Digital Converter. The amplitude of the analog dither signal is determined by the architecture of the Analog to Digital Converter. The invention also provides in a second embodiment a circuit comprising a pipeline analog to digital converter for converting an analog input signal to a digital output signal and a feedback circuit coupled to the converter such that the digital output signal is adapted to have an average non linearity error value of about zero LSBs.

43 Claims, 23 Drawing Sheets

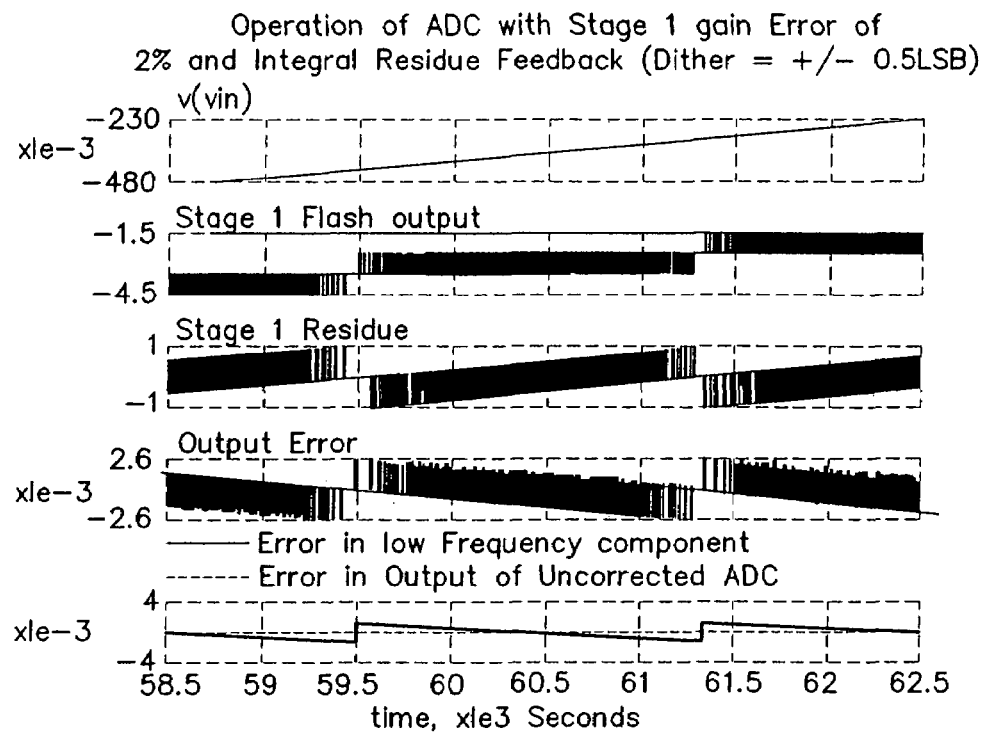
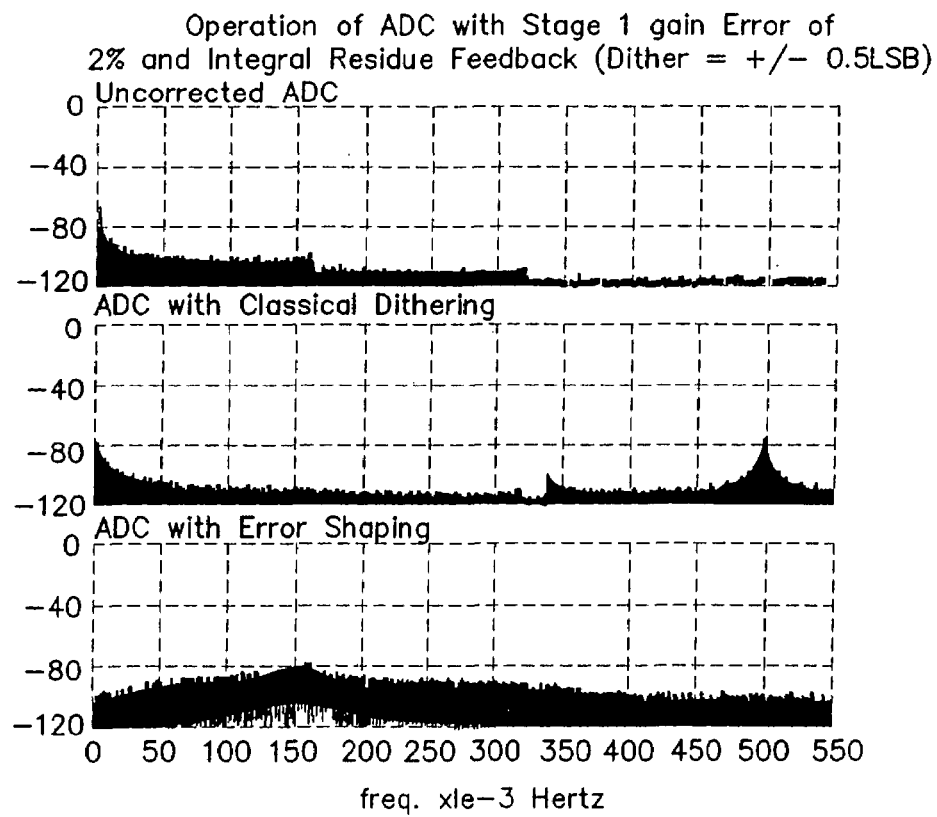
FIG. 13

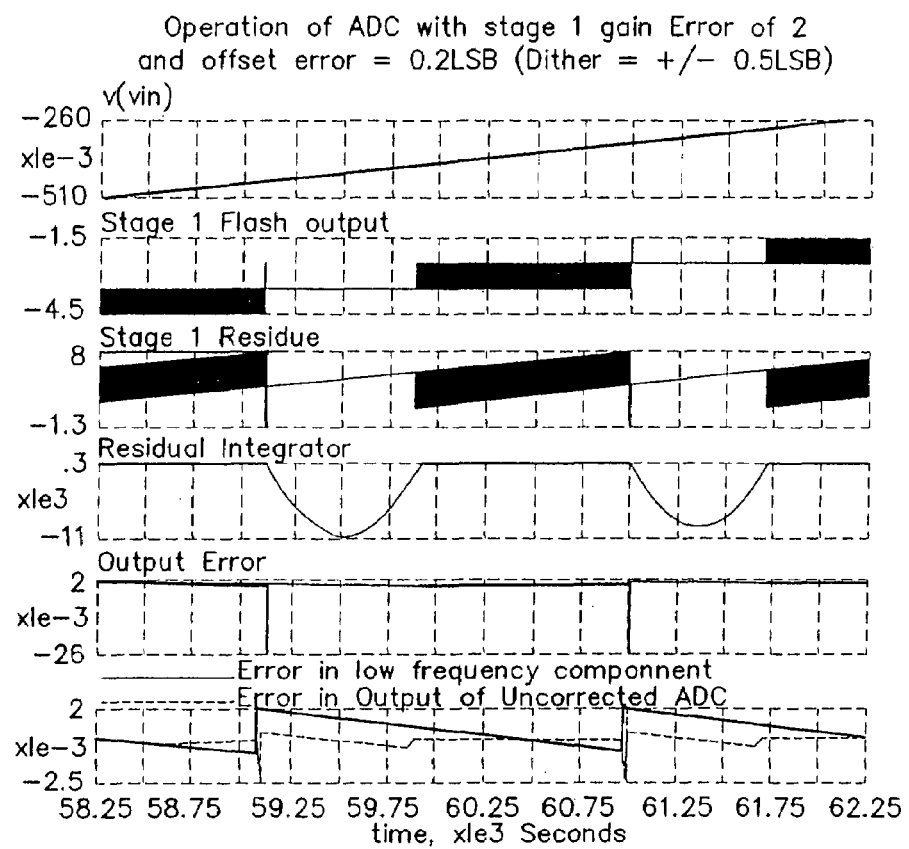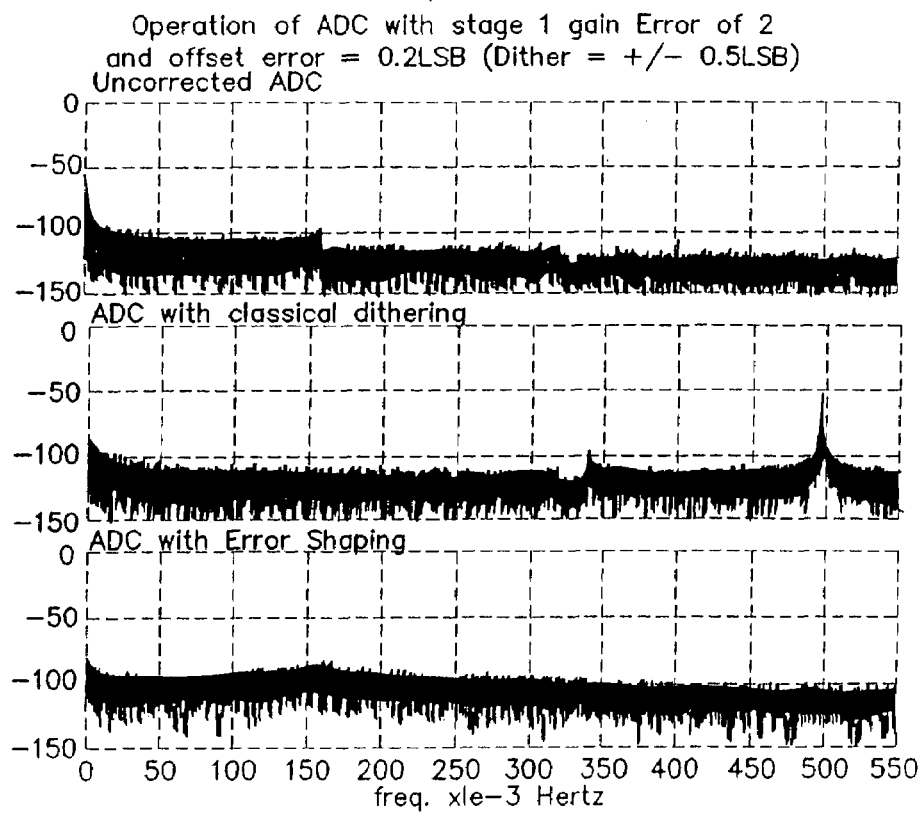
FIG. 14

Figure16 - Stage 2 Residue Characteristic with extra stages shown in Red

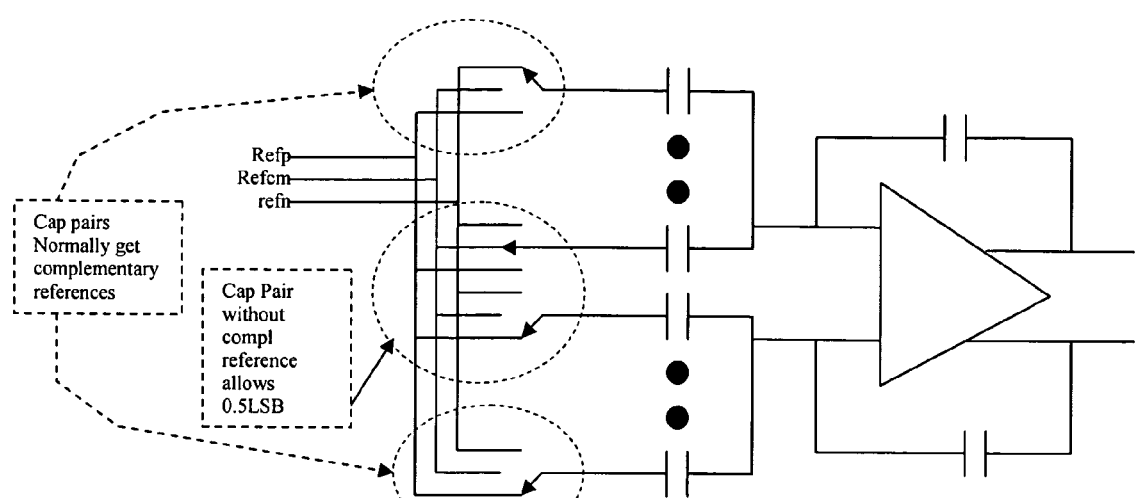
Figure 21 – MDAC During Resolve Phase

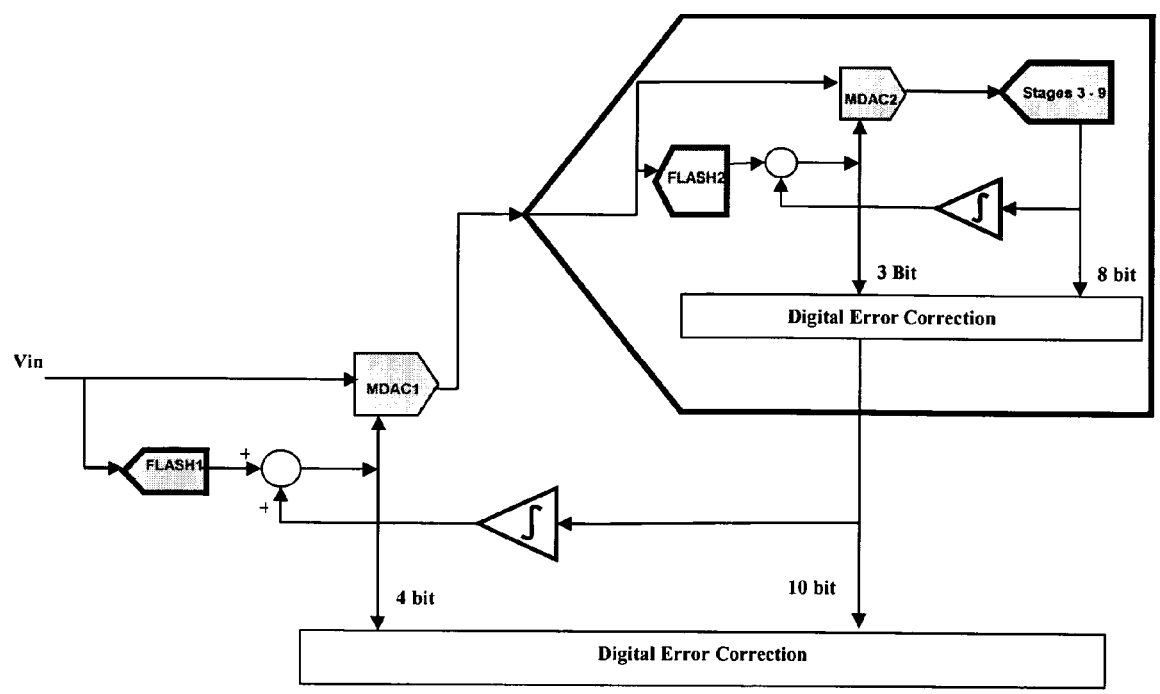
Figure 22 – ADC with 1st and 2nd Stage Error Correction

INL CURVE CORRECTION IN A PIPELINE ADC

FIELD OF INVENTION

The present invention relates to a method and system for reducing integral non linearity errors in a pipeline Analog to Digital Converter (ADC).

BACKGROUND TO THE INVENTION

Analog to Digital Converters are used in a wide variety of applications in the electronics industry, such as in digital television processing and in the conversion of analogue video onto DVD's. One type of ADC which is commonly used is a pipeline ADC. This ADC requires less components than that required by a flash ADC to carry out the same digital conversion. A pipeline ADC generally also performs a conversion quicker than a SAR converter, as in a SAR converter the conversion time is proportional to the number of bits to be converted. Consequently, a pipeline ADC is often favoured in applications where both a relatively fast conversion time is required and where the number of circuit components is to be kept to a minimum.

One of the main drawbacks of pipeline Analog to Digital Converters is that they are prone to architecture dependent integral non linearity (INL) errors. These errors are due to non-linearities present in the ADC, and manifest themselves as a curve in the output digital signal. Ideally, an INL curve would have all zero values, so that the resulting digital conversion would be an error free signal.

These INL errors are caused by a variety of sources, such as capacitor mismatch, stage gain errors and incomplete settling at higher sample rates (effectively dynamic gain errors). Each INL curve has a form specific to the topology of the pipeline ADC associated with it. For a pipeline ADC with a multi-bit first stage, the INL curve will have a periodic form, with the number of cycles corresponding to the number of decision levels in the first stage.

The table below shows typical parameters for an ADC when operating at 54 MS/s and 110 MS/s.

| Present ADC Typical Specifications | | | |
|---|---|---|---|
| Parameter | 54 MS/s Operation | 110 MS/s Operation | Units |
| Resolution | 12 | 10 | bits |
| INL | +/−5 (12 bit) | +/−5 (10 bit) | LSBs |
| DNL | +1/−0.5 (12 bit) | +1/−0.5 (10 bit) | LSBs |
| SINAD | | | |
| Fin = 1 MHz | 63 | 57 | dB |
| Fin = 6 MHz | 61 | 55 | dB |
| Fin = 15 MHz | 57 | 53 | dB |
| SNR (to Nyquist) | 65 | 60 | dB |
| Input Range | −1.2 to +1.2 | −1.2 to +1.2 | V diff |
| Supply Voltage | 3.3 | 3.3 | V |
| Supply Current (Including SHA) | 40 | 45 | mA |

These ADC specifications, although reasonable for the size and power dissipated, when used in applications such as video applications result in errors which manifest themselves as low frequency artefacts which are visible. The errors appear as an INL curve in the output converted signal. The nature of video applications means that linearity errors tend to be most visible when a signal with low frequency content is being processed, as it has been found that the human eye is very sensitive to low frequency errors in a video picture.

A typical INL curve can be seen in the graph of FIG. 1, for a pipeline ADC with a 4 bit $1^{st}$ stage. It can be seen from this graph that the amplitude of the short term deviations which are superimposed on the INL curve increase with sample frequency. This is mainly due to the incomplete settling out of the $1^{st}$ stage MDAC. This occurs when for example the gain of the first stage MDAC amplifier for this ADC does not result in its correct value. If the gain is not correct, then the output of the MDAC (i.e. the residue) which is passed to the rest of the ADC will under represent the true residue, and will accordingly result in an INL error. In cases where the gain is correct, but where the amplifier has insufficient time to settle to the correct final value, the effect will also appear like a gain error and give a corresponding INL error. The circumstance in which insufficient time is allowed for settling out of the MDAC arises when the sample rate is too high.

FIG. 2 illustrates the effect integral non-linearity errors have on a pipeline ADC with a multibit $1^{st}$ stage when processing a video signal. For a slowly varying video signal, such as a signal that gradually ramps from black to white across the screen, it can be seen that the INL curve sawtooth creates a low frequency error on the video signal. For the black to white ramp, this is clearly visible as vertical bands in the picture. As a result, an imperfect video out signal is produced.

Consequently, it is desirable in applications such as video applications that particular attention be paid to eliminating low frequency artefacts in order to provide the best possible quality of output signal. However, the characteristic INL curve of a pipeline ADC makes these errors difficult to eliminate without expending a lot of power and area (more power and area gives quicker amplifier settling).

One method which has been used to reduce the effects of the INL curve is to dither the analog input with random noise, in order to mask the quantization noise. Another method involves dithering the analog input with random noise and removing the noise in the digital domain to correct for differential non-linearity (DNL) errors. The drawback of adding random noise is that in order to reduce the INL error, the noise must be of an amplitude sufficient to result in the output waveform changing from a staircase-like waveform (as a result of the errors), to that approaching the ideal waveform (a ramp). This value of amplitude is generally quite significant.

Another method which has been used to overcome the above outlined problems is to use a dithering scheme for video ADCs. The video signal is dithered with random noise at the video line rate and the dither is removed after digitisation. The effect of this is to make the INL errors unobvious to the eye, by placing them at a different point on each video scan line. However, this method does not actually eliminate the INL errors. Each line still has the error, but in a different place to the previous line. The error is in fact only hidden by the "vertical" filtering of the eye.

A further well known technique for removing INL errors involves dynamic element matching (DEM). This uses randomisation of the order of usage of the capacitor elements in the $1^{st}$ stage MDAC of a pipeline ADC. In this technique, a 4 bit MDAC uses capacitors and an amplifier to implement the function Vout=8 *(Vin−D*Vref/16) where D is in the range 0 to 15. 16 capacitors are used to couple Vref or zero in the above equation. This technique compensates for the case where capacitors don't match (for example, if there is a capacitor which is larger than the other capacitors), which would generally result in some values of D having more weight, and consequently steps appearing in the ramp transfer function. In DEM, advantage is taken of the fact that the error caused by this capacitor would occur in the same place in a ramp signal applied to the ADC. The technique therefore rotates the capacitor usage so that the same capacitor is not used in the same position each time. As a result, the error moves about rapidly and is thus not noticeable to the human eye. However this technique only addresses the INL errors due to capacitor mismatch, and not those due to settling or gain errors, which are, in fact, more pronounced.

There therefore exists a need to provide an improved method for correcting INL curves in a pipeline ADC.

SUMMARY OF THE INVENTION

The invention provides a method for optimising the output of a pipeline Analog to Digital Converter to reduce integral non linearity errors, the method comprising the steps of:

adding an analog dither signal to the analog input signal of a pipeline Analog to Digital Converter, and converting the analog input signal to a digital output signal by means of the pipeline Analog to Digital Converter, wherein the amplitude of the analog dither signal is determined by the architecture of the Analog to Digital Converter.

By adding an analog dither signal which is determined by the architecture of the Analog to Digital Converter, the non linearity errors can be made equal and opposite on subsequent clock cycles. This gives the impression to the eye that the digital output is correct (i.e. error free), because of the eye's tolerance to high frequency errors. Consequently, the impact of the INL errors is minimized in the digital output signal.

Preferably, the method further comprises the step of subtracting the digital equivalent of the added analog dither signal from the digital output signal.

This reduces the amount of noise which would otherwise still be present at the high frequencies.

Desirably, the amplitude of the analog dither signal is near or equal to the full scale value of the Analog to Digital Converter divided by $2^{n+1}$, where n is equal to the number of bits in the first stage of the Analog to Digital Converter.

Preferably, the analog dither signal has a frequency of about half of the sampling frequency.

In one embodiment, the Analog to Digital Converter may have a 4 bit first stage and the dither signal may have an amplitude of about 1/32 times the full scale of the Analog to Digital Converter which is added to the analog input on alternate clock cycles.

In another embodiment, the Analog to Digital Converter may have a 4 bit first stage and the dither signal may have a amplitude of 1/64 times the full scale of the Analog to Digital Converter, wherein the dither signal is added on a first clock cycle and the dither signal is subtracted on the consecutive clock cycle.

Preferably, the dither signal is substantially a square wave.

Desirably, the dither signal is produced by means of a switched capacitor Sample and Hold Amplifier.

The invention also provides circuit for optimising the output of a pipeline Analog to Digital Converter to reduce integral non linearity errors, the circuit comprising:

means for adding an analog dither signal to the analog input signal of a pipeline Analog to Digital Converter; and a pipeline Analog to Digital Converter for converting the analog input signal to a digital output signal;

wherein the amplitude of the analog dither signal is determined by the architecture of the Analog to Digital Converter.

In accordance with a second embodiment of the invention, the invention provides a pipeline analog to digital converter circuit for reducing non linearity errors, the circuit comprising a pipeline analog to digital converter for converting an analog input signal to a digital output signal and a feedback circuit coupled to the converter such that the digital output signal is adapted to have an average non linearity error value of about zero volts.

The feedback loop is adapted to force the MDAC output of the converter to have an average value of zero, which in turn results in the average non linearity error value being about zero.

Preferably, the feedback circuit comprises a sigma delta modulator.

Desirably, the sigma delta modulator comprises an integrator and a digital summer.

Preferably, the pipeline analog to digital converter comprises a plurality of stages, each stage providing two output signals, wherein the first output signal of the first stage is a digital estimate of the input voltage and the second output signal of the first stage is an analog multiple of the error between the digital estimate of the input voltage and the actual value of the input voltage.

Preferably, the first output signal is generated by a flash analog to digital converter, and the second output signal is the residual output from an MDAC.

Desirably, the sigma delta modulator integrates the residual output.

Preferably, the output from the flash analog to digital converter is summed with a dither signal.

Desirably, the sum of the flash analog to digital converter output and the dither signal is passed to the MDAC.

Preferably, the output of the integrator is used to control the dither signal.

The dither signal may be a multiple of the least significant bit of the flash analog to digital converter.

Preferably, the multiple is negative when the polarity of the integrator output is negative.

Desirably, the multiple is about 0.5 or −0.5 as determined by the polarity of the integrator output.

The value of the multiple may be about −1. −0.5, +0.5 or +1 as determined by the output of the integrator.

The value of the multiple of the error between the digital estimate of the input voltage and the actual value of the input voltage may be about eight.

The integrator may be a digital integrator.

The stage 2 flash may be provided with one or more comparators in addition to the comparators required for processing of signal, the comparators providing about two times interstage redundancy, in order to provide additional signal range to accommodate the sigma delta activity in the previous stage.

The pipeline analog to digital converter circuit may further comprise a second sigma-delta modulator in stage 2 of the converter.

The least significant bit may be represented by two capacitors.

The MDAC may incorporate non complementary reference switching.

The 0.5LSB may be subtracted in the analog domain.

Where the converter incorporates offset errors, the errors may be monitored and controlled in the digital domain.

The present invention also provides a method for reducing non linearity errors in a pipeline analog to digital converter circuit, the method comprising the steps of: converting an analog input signal to a digital output signal by means of a pipeline analog to digital converter;

and creating a feedback loop coupled to the converter such that the digital output signal is adapted to have an average non linearity error value of about zero volts.

BRIEF DESCRIPTION OF THE DRAWINGS

Embodiments of the invention will be described with reference to the accompanying drawings in which:

FIG. 13 shows for an idealised model plots of the operation of an ADC with stage 1 gain error of 2 using the implementation of FIG. 12;

FIG. 14 illustrates how errors which cause an offset in the residue influence the ADC plots;

FIG. 21 shows how two capacitors may be used to represent an LSB in the MDAC operation of the second embodiment of the invention; and FIG. 22 shows the complete block diagram for the ADC of the second embodiment of the present invention with stage 1 and stage 2 error correction.

DESCRIPTION OF PREFERRED EMBODIMENTS

The present invention will now be described with reference to particular embodiments and with reference to certain drawings, but the invention is not limited thereto but only by the claims.

In accordance with a first embodiment of the invention, a subtractive dithering technique is used to reduce integral non-linearity errors in a pipeline Analog to Digital Converter. The first embodiment is described in detail in the paragraphs below, with reference to FIGS. 3 to 7.

Figure 3:
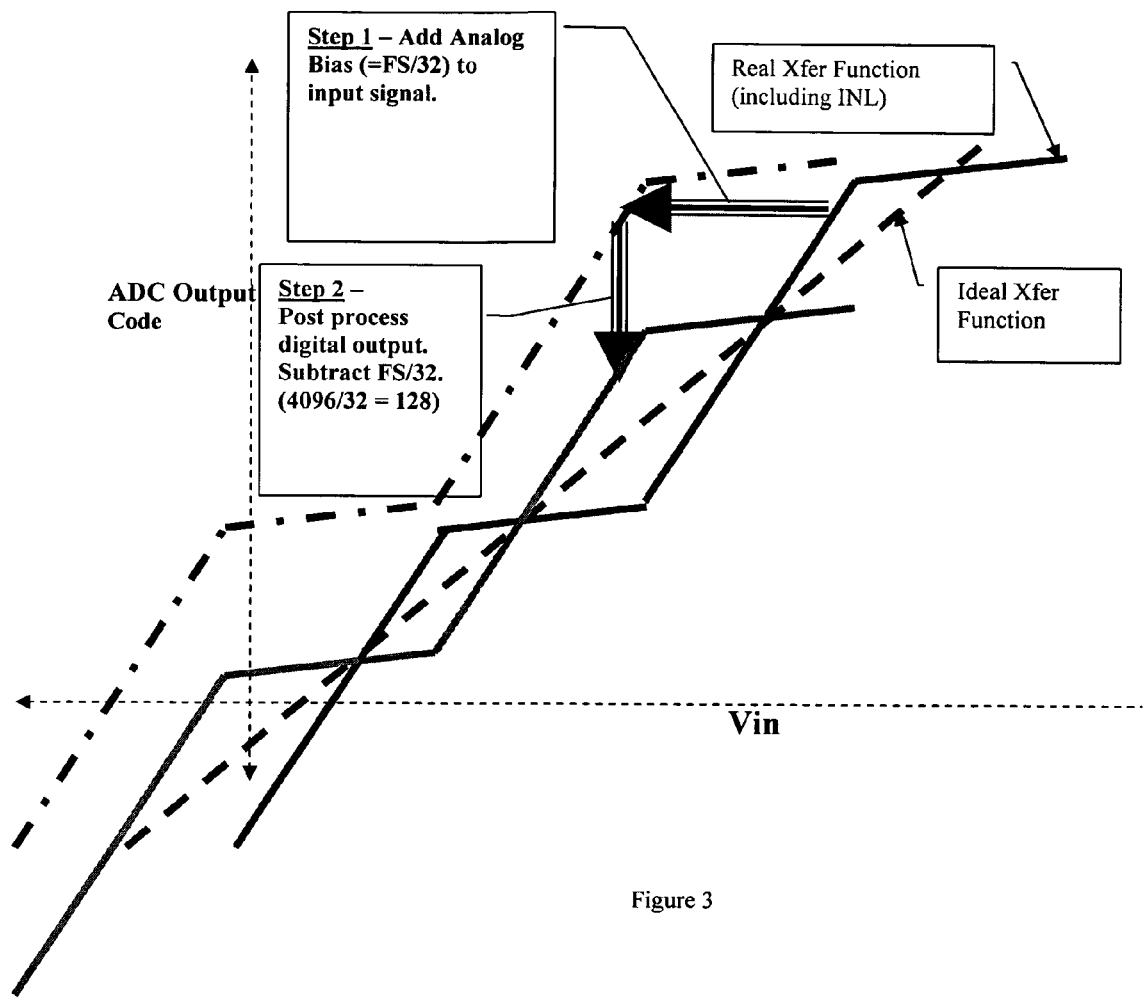
FIG. 3 details the steps of the method of the first embodiment of the present invention.

FIG. 3 shows a typical real transfer function of a converted digital signal for an ADC which has INL errors. It will be appreciated that this transfer function with the INL errors resembles a staircase waveform. It also shows an ideal transfer function of a converted digital signal i.e. that of a converted digital signal exhibiting no INL errors. The method of the first embodiment of the present invention processes the real signal so that the resulting converted digital signal approximates the ideal transfer function when viewed by the human eye. In brief, this embodiment adds an analog dither signal at the input to the ADC and subtracts it in the digital domain.

Figure 4:
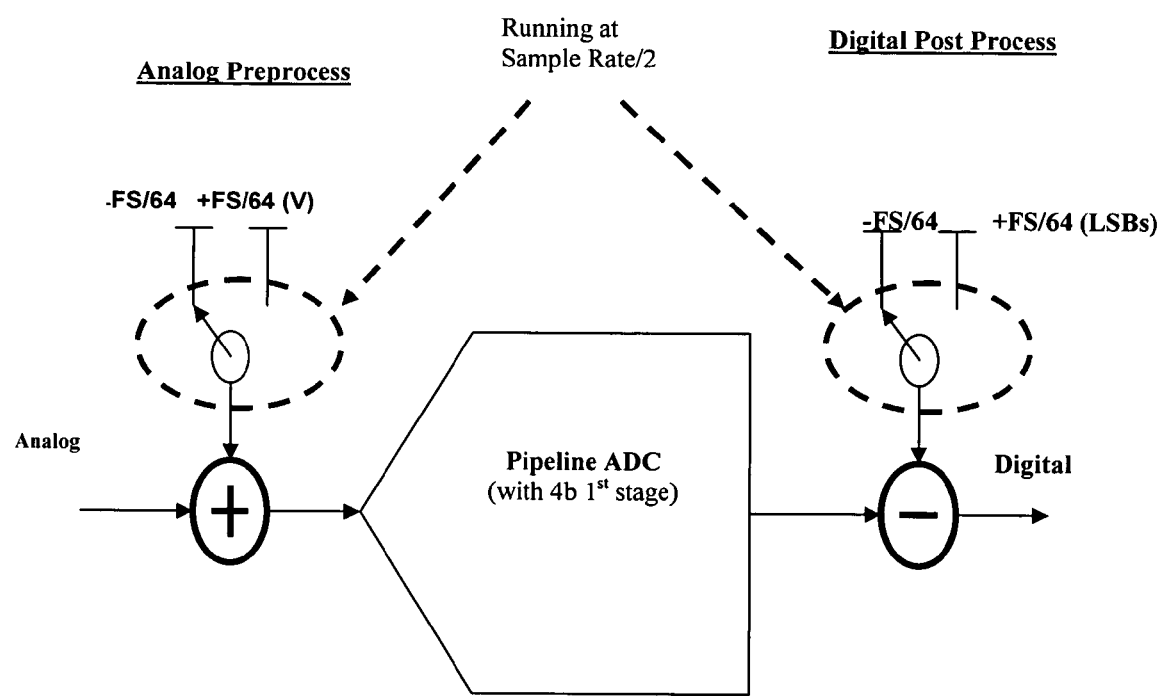
FIG. 4 is an implementation block diagram of the steps of FIG. 3.

The first step of the method of the first embodiment of the invention is to preprocess the analog input signal, as shown in FIGS. 3 and 4. This involves adding an analog bias at the input of the ADC, also known as an analog dither signal. In the described embodiment, the bias is a square wave and has a frequency of $F_s/2$ (i.e. the sampling frequency/2). This means that an analog bias is added to the input signal on alternate clock cycles. An example of this is shown in step 1 of FIG. 3, where a bias having an amplitude equal to 1/32 of the full scale is added on alternate clock cycles (or more precisely, ½ of one of the 16 INL periodic deviations on the INL characteristic). Alternatively, the same effect is achieved by adding an analog bias on every other clock cycle while an analog bias is subtracted on the alternate cycles. An example of this is shown in the preprocessing step of FIG. 4, where the full scale value divided by 64 is added and subtracted on consecutive clock cycles respectively.

The amplitude of the dithering signal is specifically chosen to match the particular bit architecture of the ADC, in order to target the INL errors. This is determined by the number of bits in the first stage, which in turn determines the number of steps in the staircase waveform. The appropriate amplitude of the dither or biasing signal can be calculated from the equation:

value=full scale value of the Analog to Digital Converter divided by $2^{n+1}$, where n is equal to the number of bits in the first stage of the ADC. The addition of the bias results in the transfer function shifting to the left, as can be seen in the transfer characteristic of step 1 of FIG. 3.

The preprocessed analog signal with the superimposed analog dither signal is then passed to the input of the pipeline ADC, as shown in FIG. 4, which converts the analog signal into the digital domain.

The output digital signal is then post processed in order to remove the bias. For an ideal ADC this achieves nothing. However, for an real ADC like the one shown in FIG. 3, the effect is that the input signal is now digitized with the transfer characteristic shown in Step 2 of FIG. 3.

Figure 5:
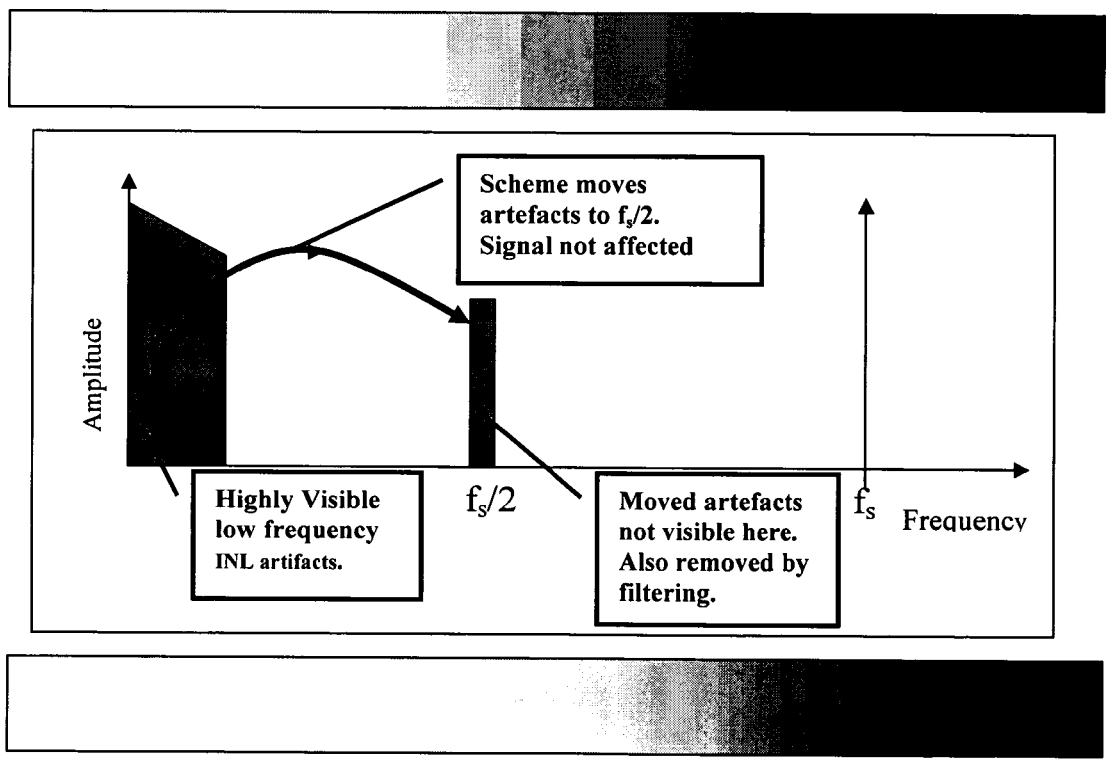
FIG. 5 illustrates how the INL errors which resided in the low frequency part of the spectrum are modulated up to a high frequency in the spectrum due to the first embodiment of the invention.

The net effect of the above steps is that the analog input signal is digitized using the real ADC transfer characteristic exhibiting INL errors on every second clock cycle (for example on the odd clock cycles), and is digitized using the transfer characteristic of step 2 on the clock cycles in between (for example on the even clock cycles). It can be seen that this results in the INL errors which resided in the low frequency part of the spectrum being modulated up to a high frequency in the spectrum (i.e below Fs/2), as illustrated in FIG. 5. As a result, the transfer function of the post processed digital signal closely approximates the ideal transfer function at low signal frequencies.

As the real transfer characteristic and the step 2 transfer characteristic have INL errors that are equal and opposite at all points along the curve, as can be seen from FIG. 3, by hopping between them, it gives the impression to the eye that the output is correct, because of the eye's tolerance to high frequency errors. Consequently, the impact of the INL errors is minimized in the viewed video picture.

Subsequent digital filtering can then eliminate the noise completely, if required. Alternatively, where the ADC is being used in low frequency applications, such as video applications, further filtering is often not even necessary, due to the inherent low pass filtering of the human eye.

The first embodiment of the invention could be implemented without the post processing step to remove the bias. However, if the bias were not removed, there would be a significant amount of noise still present, although it would be at high frequency.

It should be noted that the overall shape of the INL curve is unaffected and the dithering scheme also has only a modest effect on the INL error as expressed in LSBs. However, the scheme very effectively removes the periodic fluctuations associated with the pipeline converter, and consequently has a dramatic effect on picture quality.

Figure 6:
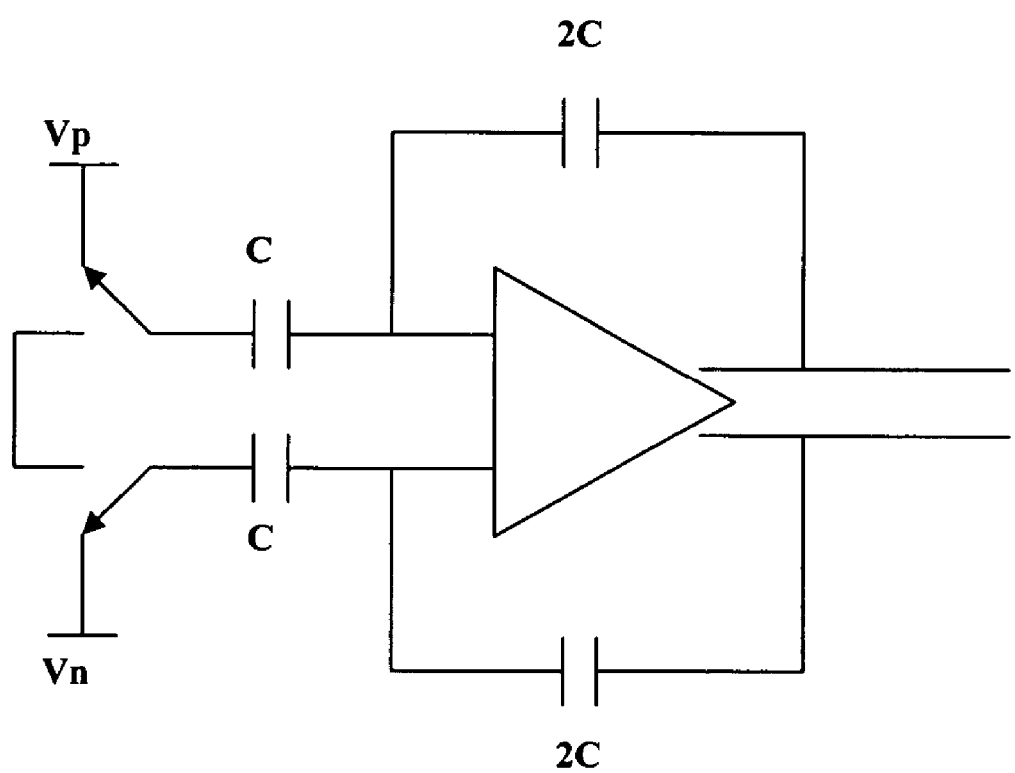
FIG. 6 shows a schematic diagram of a switched capacitor (SC) sample-hold amplifier (SHA) used in implementing the first embodiment of the invention.

There are a number of methods by which the dithering process may be implemented. One method involves using a switched capacitor (SC) sample-hold amplifier (SHA), and is illustrated in FIG. 6. This figure shows a switched capacitor Sample and Hold Amplifier (SHA) in its settling phase. If the switches shown are configured to connect the capacitors together, the output is given by Vout=3/2(Vin)(the Vin sampling phase is not shown).

However, when the switches are configured as shown, the output is given by Vout=3/2(Vin)−(Vp−Vn)/2

It should be noted that Vin and Vout are differential in the above equations.

Figure 1:
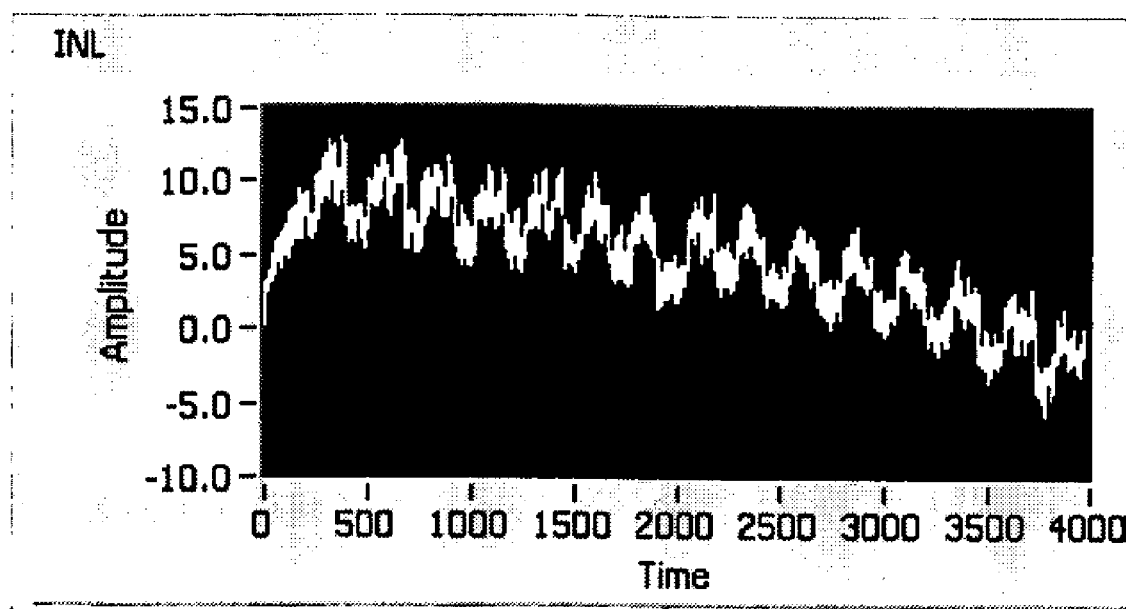
FIG. 1 shows a typical integral non-linearity (INL) curve for a pipeline ADC.
Figure 7:
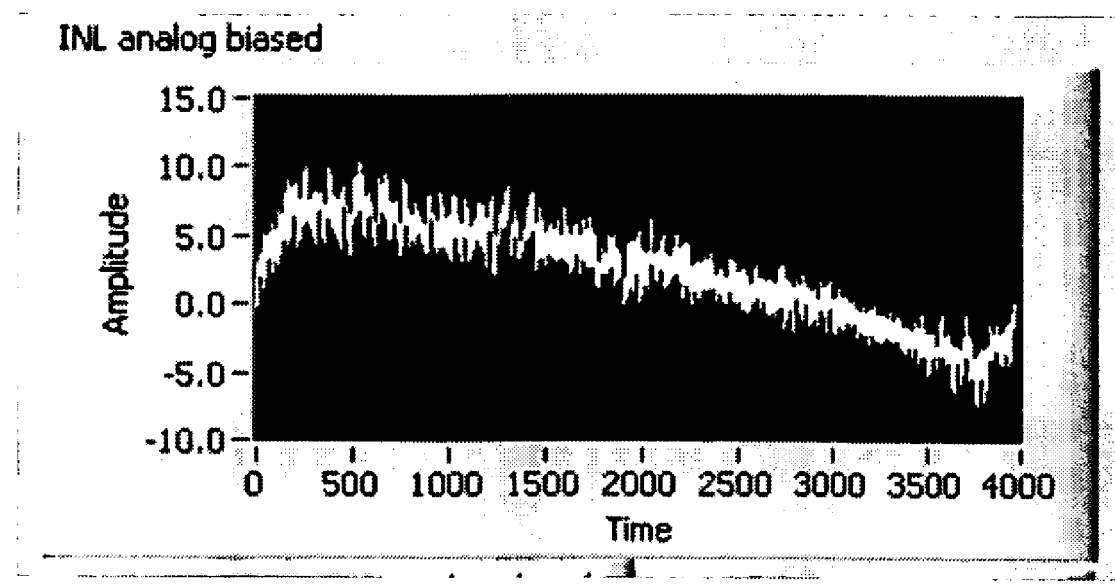
FIG. 7 shows the INL curve which results from the first embodiment of the present invention.

FIG. 7 shows the INL curve for the same pipeline ADC as shown in FIG. 1, when the converter incorporates the method of the first embodiment of the present invention. The resulting improvement in the shape of the INL curve from FIG. 1 to FIG. 7 is very noticeable—it can be seen that the sharp INL errors have been removed.

However it will be appreciated that a number of other suitable implementations could be alternatively used to achieve the same effect.

Figure 8:
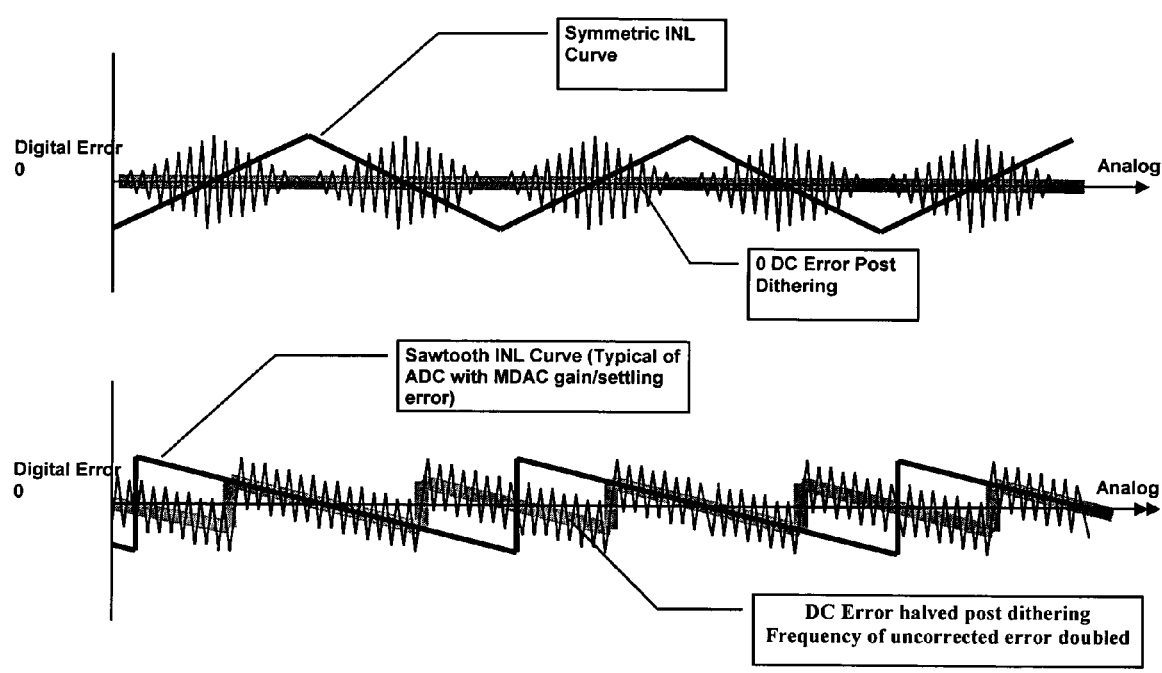
FIG. 8 illustrates how the first embodiment of the invention effects a a) symmetric and b) a sawtooth waveform.

The effectiveness of the dithering method of the first embodiment of the invention depends on the nature of the INL curve characteristic. It has been found that a square or a triangular shaped waveform is completely corrected. However, for a sawtooth shaped waveform, the scheme of the first embodiment results in half of the error signal being modulated to fs/2, while the remainder is doubled in frequency. This means that, as ADC sample rates increase, the dither scheme cannot be fully effective in dealing with artefacts associated with amplifier gain and settling errors. This can be seen from the graph of FIG. 8 which shows how the first embodiment of the invention effects a a) a symmetric waveform and b) a sawtooth waveform. As sawtooth waveforms are typical for pipeline ADCs with MDAC gain or settling errors, there is a need to provide a method which can reduce INL errors for sawtooth waveforms. The second embodiment of the present invention provides such a method, and is described with reference to FIGS. 9 to 22.

Figure 2:
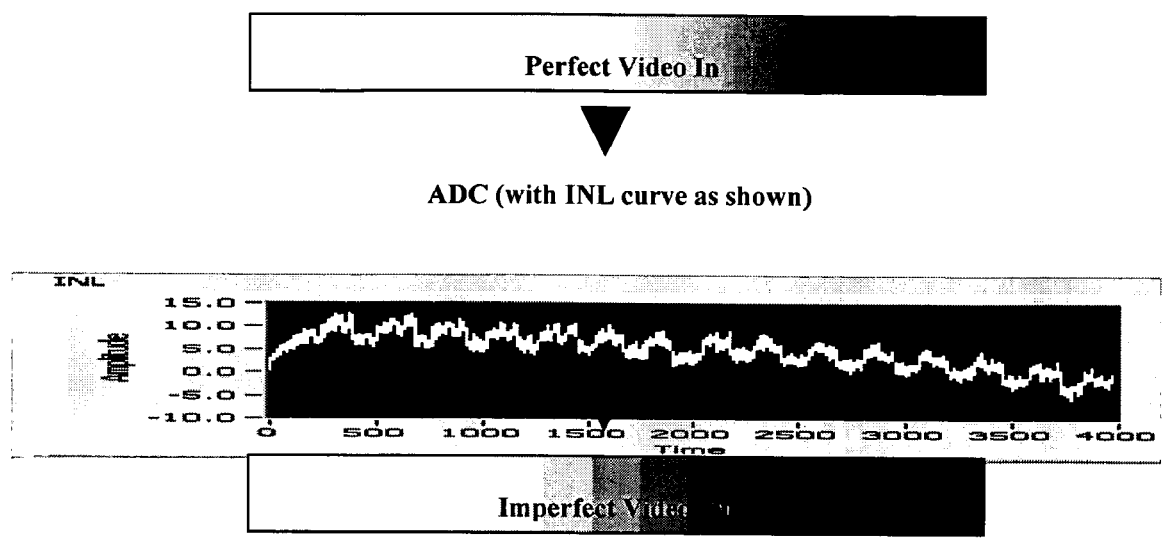
FIG. 2 illustrates the effect INL errors in a pipeline ADC with a multibit $1^{st}$ stage has on the processing of a video signal.
Figure 9:
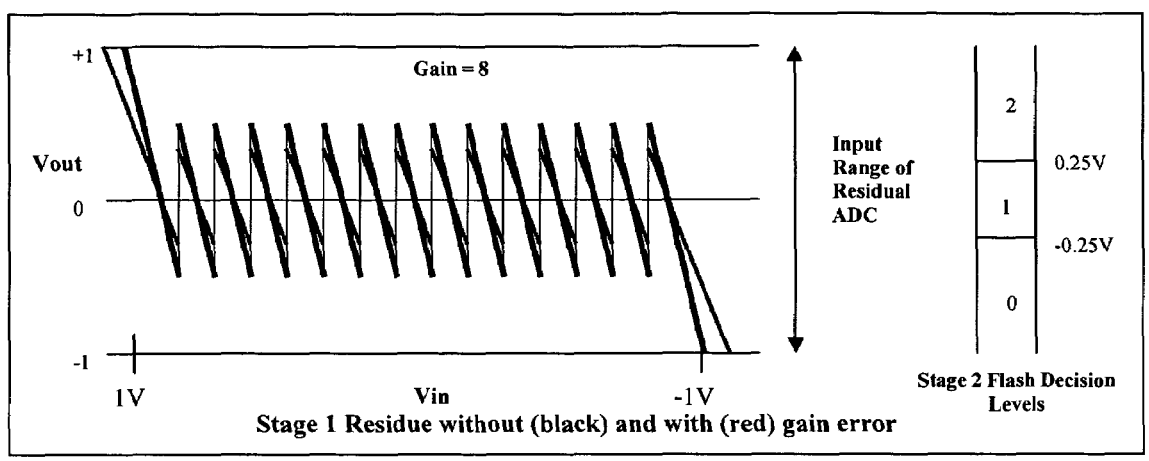
FIG. 9 illustrates a typical Stage 1 Residue of a pipeline ADC stimulated with a negative going ramp and how it maps onto a stage 2 flash converter.

In seeking to develop a scheme which deals more effectively with stage gain errors it is helpful to look at the pathology of the MDAC gain error that causes this characteristic. FIG. 9 illustrates a typical Stage 1 Residue of a pipeline ADC stimulated with a negative going ramp and how it maps onto a stage 2 flash converter. The discontinuities in the transfer function correspond to the fourteen flash decision levels. As previously mentioned, a stage 1 gain error manifests itself as linearity errors because a gain error causes the output of the MDAC, which represents the residue from the 1st stage, to settle to an incorrect value. The gain error as depicted would cause an INL characteristic as shown in FIG. 2. This INL characteristic becomes more pronounced as sample rate increases, because incomplete settling is, to a first order, a gain error.

In general terms the MDAC output voltage (Vout), or residue, is given by $$Vout=G*(Vin-D)$$

where Vin is input voltage, G is the gain and D is the flash output code converted back to an analog signal (i.e. a quantised version of the input voltage). The broken line characteristic is what is expected if there were a gain error in the MDAC transfer function, as such an error propagates all the way through the ADC and manifests itself as an error in the ADC output.

It can be seen from FIG. 9 that that there is a linear (to a $1^{st}$ order) relationship between the MDAC output and the error. The INL error due to the gain error is zero when the residue is zero i.e. if the output from MDAC1 is zero then the error is also zero. It will also be appreciated that the INL error due to the gain errors are equal and opposite for residues that are equal and opposite. The digital output from stages 2 to 10 is in fact a digital representation of the stage 1 residue.

Figure 10A:
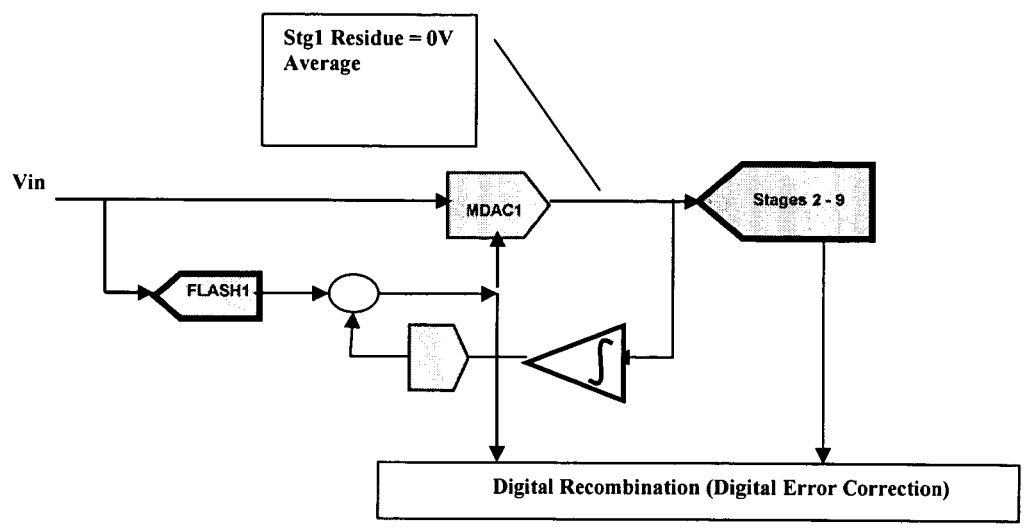
FIG. 10a shows the circuit of the second embodiment of the invention when implemented using an analog integrator.
Figure 10B:
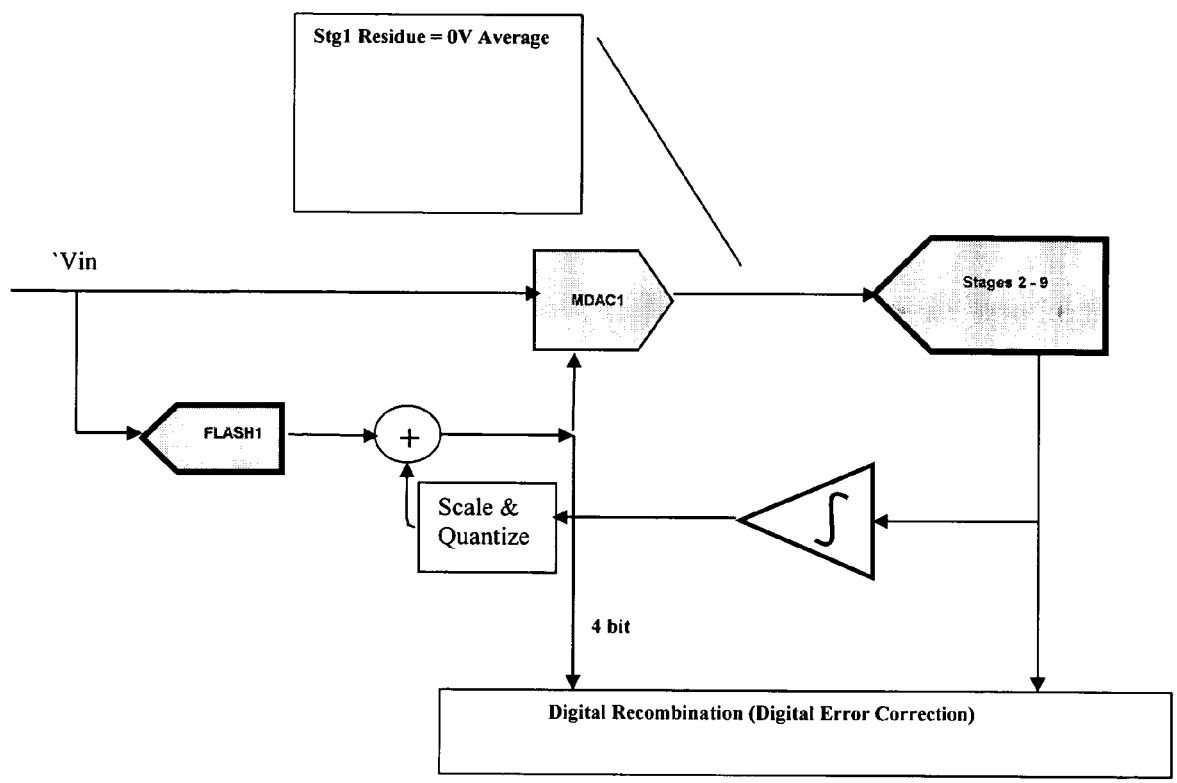
FIG. 10b shows the circuit of the second embodiment of the invention when implemented using a digital integrator.

The above observations are exploited in the second embodiment of the present invention to reduce the linearity errors of the pipeline ADC. By adding to or subtracting from the stage 1 flash output, it is possible, by hopping between the residue lines, to control the stage 1 residue in a quantised way. This is achieved in the circuit of the second embodiment, as shown in FIGS. 10a and 10b, by the use of a feedback scheme from the residual ADC to the $1^{st}$ stage flash. This feedback scheme allows the inference of the INL error, by measuring residue. For the purposes of this figure, it is expedient to represent the flash and the MDAC from stage 1 separately. Stages 2 to 9 are represented as a separate residual ADC.

When the output from the residual ADC is integrated and the output of that integrator is summed or added to the output from the stage 1 flash in a quantised way, a sigma delta loop is created. The summed signal is then passed to the MDAC. Negative feedback is achieved because the MDAC implements a subtraction of the flash output from Vin. The output of this flash ADC is controlled in a scaled and quantised way by the output of the integrator such that the "average" value of the MDAC1 output is zero. This ensures that the "average" value of the non linearity errors is also zero.

In the described embodiment, the output from the flash analog to digital converter is summed with a dither signal. The dither signal is a multiple of the least significant bit of the flash analog to digital converter. The dither signal is controlled by the output of the integrator. When the integrator output is negative, the dither signal is negative. Conversely, the dither signal is positive when the polarity of the integrator output is positive.

Much of the circuit in FIGS. 10a and b comprises the standard components of a pipeline ADC. The first stage is shown broken into its components (Flash and MDAC) while all the subsequent stages are shown as a sub ADC or residual ADC.

The circuit of the second embodiment of the invention results in the reduction of INL errors, due to the fact that in a pipeline ADC the first stage flash makes an estimate or "guess" or a rough 4 bit digitization of the input signal. This is permitted to be highly inaccurate. This initial estimate is then subtracted from the input signal and the value gained up (Vout=8*(Vin−estimate) before being passed to the residual ADC where the process starts all over again. These estimates are recombined in logic known as "digital error correction" to give the correct digital converted output. A key feature of pipeline ADCs is that every digitization is allowed to be very rough. The reason for that is that any error in this estimate is built into the analog residue sent to the residual ADC where it gets accommodated downstream. This is known as redundancy.

It will be appreciated therefore that all the accuracy of the pipeline ADC is carried in the MDACs, while the flashes can be highly inaccurate. For example, the flash might estimate 5 and the MDAC might output 1V, or the flash might guess 6 and the MDAC will output −1V. Both these scenarios would eventually lead to the same correct digital output at the end. This fact is exploited in the circuit of the second embodiment of the invention.

In order to reduce the INL errors, the second embodiment of the invention incorporates into the pipeline ADC an integrator and a digital summing node. Due to the MDAC operation described above, it is possible to influence the output of the MDAC by altering the flash output (the estimate). It will also be appreciated that it is possible to alter the flash output without altering the final output code, so long as the amount of alteration does not fall outside the allowed inaccuracy of the flash. The integrator can be analog or digital. FIG. 10a shows an analog integrator, while FIG. 10b shows a digital integrator. If the integrator is analog, then it integrates the residue itself directly, as shown in FIG. 10a. Alternatively, if the integrator is digital, then it uses the output of the residual ADC as its input, as shown in FIG. 10b.

Ideally, it would be desirable to have the output of the MDAC equal to zero all the time, so as to reduce the INL errors to zero. While this is not possible, it is possible to force it to have an "average" value of zero by forcing it to hop around zero. This is achieved by the placing of an integral feedback loop around the first stage, as shown in FIGS. 10a and 10b.

The effect of this circuit is best explained by taking the case where that the MDAC output is positive. This gives a positive output from the residual ADC. This causes in turn the integrator to ramp upwards. When it crosses zero, it causes the flash output to be incremented by 1. Because of the MDAC transfer function, this caused the MDAC output to jump down to compensate for the increased flash output. Consequently, even for a low frequency or fixed analog input, the MDAC output (or residue) will hop up and down above and below zero in such a way that its average is zero. As a result, the average of the INL error also becomes zero, and so the integral non linearities are minimised.

This implementation is in essence a delta sigma modulator with an integrator in the feedback loop. The resulting effect is to move the INL errors to high frequency in a "noise shaped" manner, and there is little error at low frequencies, and zero error at DC.

The effectiveness of the sigma delta scheme of the second embodiment of the invention is best explained by using an idealised model. In the idealised model, there are no offset errors, no stage 2 errors, no headroom issues and no quantiser saturation.

Figure 11:
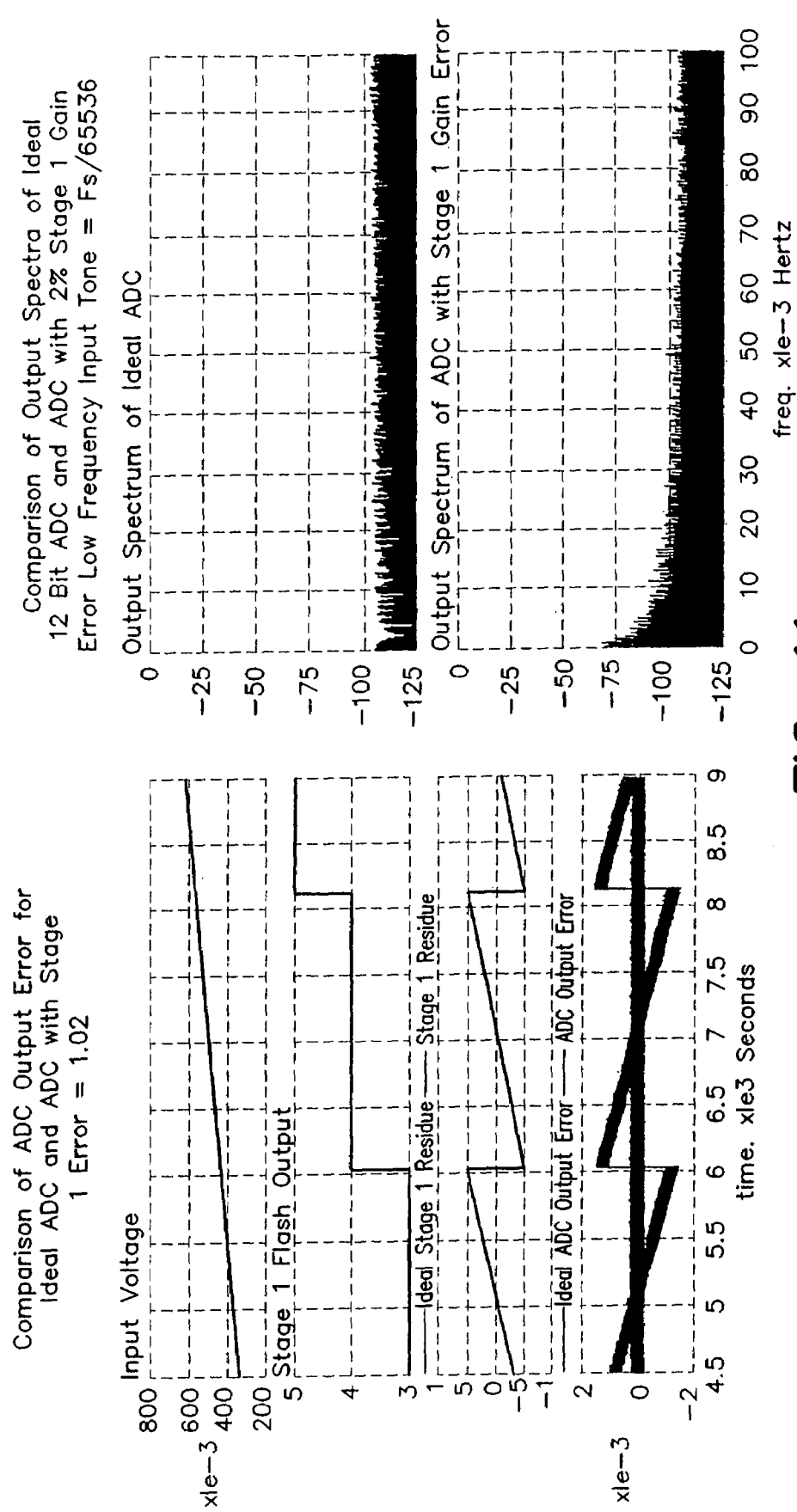
FIG. 11 shows an idealised model of plots comparing voltage values for an errorless ADC and an ADC with a gain error of 2% in the $1^{st}$ stage MDAC.

The plots of FIG. 11 compare using the idealised model, an errorless ADC and an ADC with a gain error of 2% in the $1^{st}$ stage MDAC. The left hand plots are time domain plots. Four plots are shown for an ADC processing of an input ramp signal, namely plots of the input ADC voltage, the $1^{st}$ stage flash output signal, the first stage residue signal, and the difference between the digital output and the input signals.

As expected, the first stage flash is simply a staircase waveform. The flash output of the ADC is a digital estimate of the input voltage, Vin. In the graph of the first stage residue signal, the first stage residue exhibits a sawtooth waveform. The sawtooth jumps down every time the first stage flash increases to the next code. As previously mentioned, the equation for the residue output is given by:

$$R=8*(Vin-D) \quad (1)$$

Where R=residue and

D=analog representation of the Flash Output.

The residue is therefore calculated as the error between the digital estimate of the input voltage and the correct value of the input voltage multiplied by 8. For the ideal ADC, the difference between the digital output and the input is equal to the quantisation noise. This is illustrated in the plot by the horizontal thick line. For a non ideal ADC however, the error at the output is dominated by the 2% $1^{st}$ stage gain error, which results in the sawtooth type error. For an n bit $1^{st}$ stage, the gain is typically $2^{n-1}$ i.e. for a 4 bit $1^{st}$ stage the gain is 8. However, the gain can be less. If the gain were more than this, such as for example $2^n$, then there would be no redundancy.

The right hand plots are frequency domain plots showing the Fast Fourier Transform of the ADC output when the ADC is stimulated with a very low frequency input tone. This provides an estimate of the noise floor and Signal to Noise Ratio (SNR) expected from the ADC. The top right hand plot is for an ideal ADC. As was the case with the corresponding time domain plot, the noise floor for an ideal ADC corresponds to the quantisation noise. The bottom right hand plot illustrates that at high frequencies there is only quantisation noise. This graph also illustrates that unwanted content due to the 2% gain error is concentrated at low frequencies.

Figure 12:
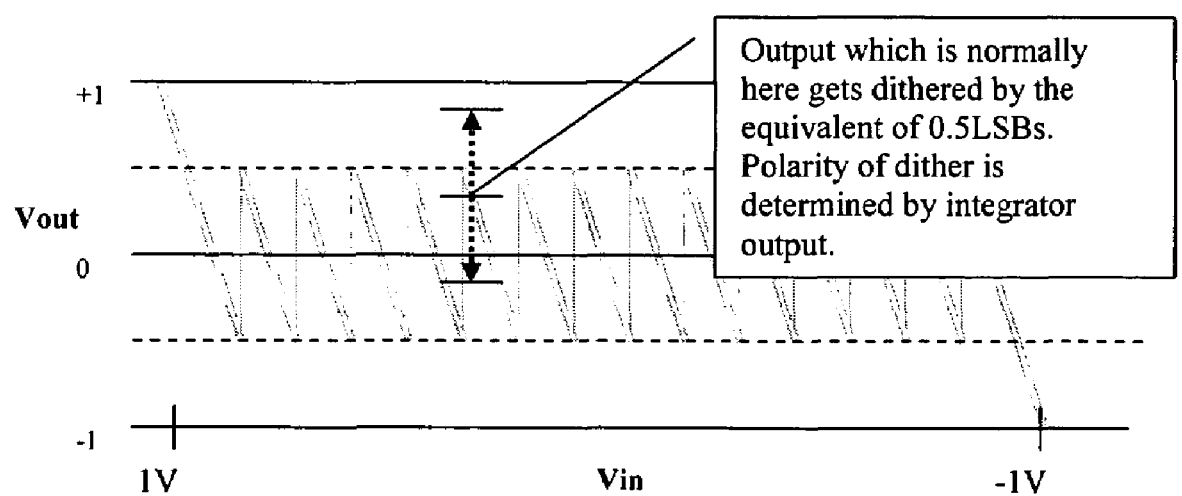
FIG. 12 shows an implementation of the sigma delta scheme of FIG. 10 by dithering +/−0.5 least significant bits (LSBs) to the stage 1 flash output.

The simplest implementation of the sigma delta scheme of the second embodiment of the invention would be to implement +/−0.5 least significant bits (LSBs) to the stage 1 flash output, depending on the polarity of the integrator output. This would provide just enough control to keep the average of the residue at zero for any Vin, as shown in FIG. 12, as required.

FIG. 13 shows plots of how such an implementation of the scheme works in the idealised model. The left hand graphs are the time domain representation, while the right hand graphs are the frequency domain representations.

Depending on the polarity of the integrator output, the flash 1 output is summed or dithered with either +0.5LSBs or −0.5LSBs. As can be seen, instead of a staircase response to the input ramp, the flash output is a staircase with some shaped noise of 1LSB amplitude added. As the flash output is dithering, then it follows that the residue will also be dithering. Consequently, rather than being the sawtooth seen in a regular pipeline ADC, the output is comprised of a sawtooth with shaped noise or dither added. The effect is that, although the instantaneous error (deviation of the ADC output from the ideal) is not reduced, the low frequency component of that error is dramatically improved. In the frequency domain the improvement is clear, where the output spectra for an uncorrected ADC, an ADC with classical dithering described earlier and an ADC with full sigma delta (SD) error shaping are compared. The spectrum for the ADC with classical dithering looks similar to that of the uncorrected ADC; in fact there is an improvement of 6 dB as expected. This plot clearly shows the significant improvement of the scheme for low frequencies, as all of the error noise has been moved up to a higher frequency.

This "noise shaping" of the second embodiment is always seen in sigma delta schemes, but has never been put to use to address ADC linearity errors before, only quantisation errors.

In a real ADC, there are a number of ADC errors which should also be taken into account when implementing the circuit of the second embodiment. One of these errors is the offset errors in stage 1 of the ADC. If one of the flash comparators has an offset error, then the residue for the portion of the MDAC output curve corresponding to that flash will also have an offset to compensate. These errors which cause an offset in the residue characteristic, are shown in FIG. 14. However, the impact of this offset for the sigma delta error shaping scheme is that there are now regions where +/−0.5LSBs is not sufficient to allow the integrator to control the sign of the residue. This may occur in cases where the "influence" that the feedback has on the sigma delta loop is not strong enough to control the errors. If this is the case, integrator "runaway" results. Even in cases where the integrator is saturated, there are still regions of the input range where the error shaping does not occur.

To accommodate offset errors, in accordance with one implementation of the second embodiment, multi level dithering is employed. There are a number of options for this, some of which are detailed in the "scaling & quantizing" table below.

Experiments with the model have shown that scheme 4 is the optimum scheme, with X set to a value of 256. For this scheme the amount of dither added to the stage 1 flash output is −1LSB, −0.5LSB, +0.5LSB, +1LSB i.e. the value cycles in sequential order between the values of about 1LSB, −0.5LSB, +0.5LSB and +1LSB.

Figure 15:
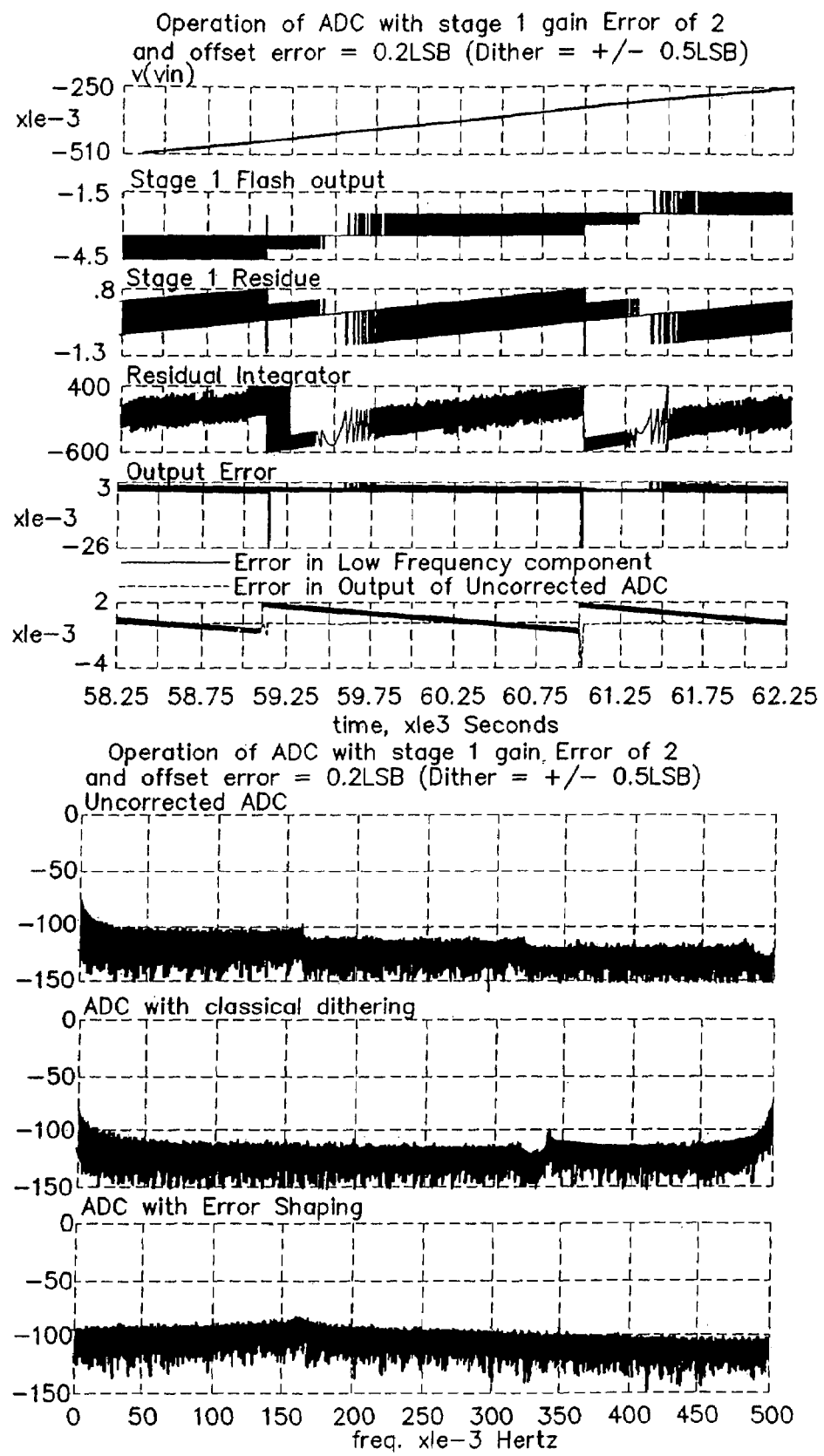
FIG. 15 shows plots of the operation of multilevel dithering of the second embodiment of the invention for an ADC with $1^{st}$ stage gain and offset errors.

When the integrator output exceeds a certain threshold, the value added at the summing node is increased from 0.5LSB to 1LSB. It should be noted that the value selected for X depends on the number of bits that are remaining. FIG. 15 shows a plot of operation of scheme 4 multilevel dithering of the ADC with $1^{st}$ stage gain and offset errors. This scheme eliminates saturation.

The multilevel dithering solves the problem of integrator runaway so that the sigma delta modulator operates across the whole input range of the ADC. However, the increased level of dither presents its own issue—the resulting noise spectrum is flat, rather than having the desired first order noise shaped characteristic. This is due to sparkle type errors which may sometime occur for one or two clock cycles when the stage 1 flash has a major transition. Sparkle errors occur because of latency in the integrator loop, and the dither being momentarily set in the "wrong" direction for a few clock cycles after a flash transition, with a resultant saturation of the $2^{nd}$ stage. Therefore, although the spectrum is still improved compared to that of an uncorrected ADC, it is still not optimum.

A simple solution to this problem would be to allow two bits of redundancy and reduce the stage 1 gain to 4. This is not an ideal solution however, because this doubles the relative significance of stage 2 gain errors. The stage 2 gain error would then be of equal significance to the stage 1 gain error, thus defeating the purpose of the scheme of the second embodiment of the present invention.

Figure 16:
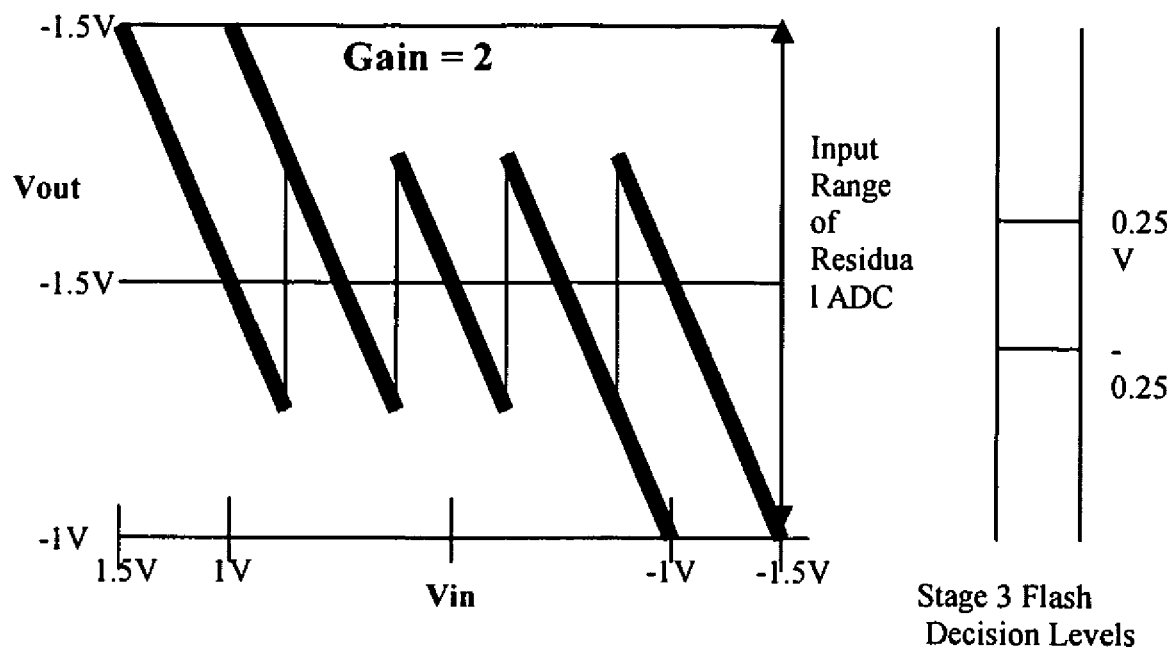
FIG. 16 shows the stage 2 residue characteristic of the second embodiment of the invention with the addition of extra comparators.
Figure 17:
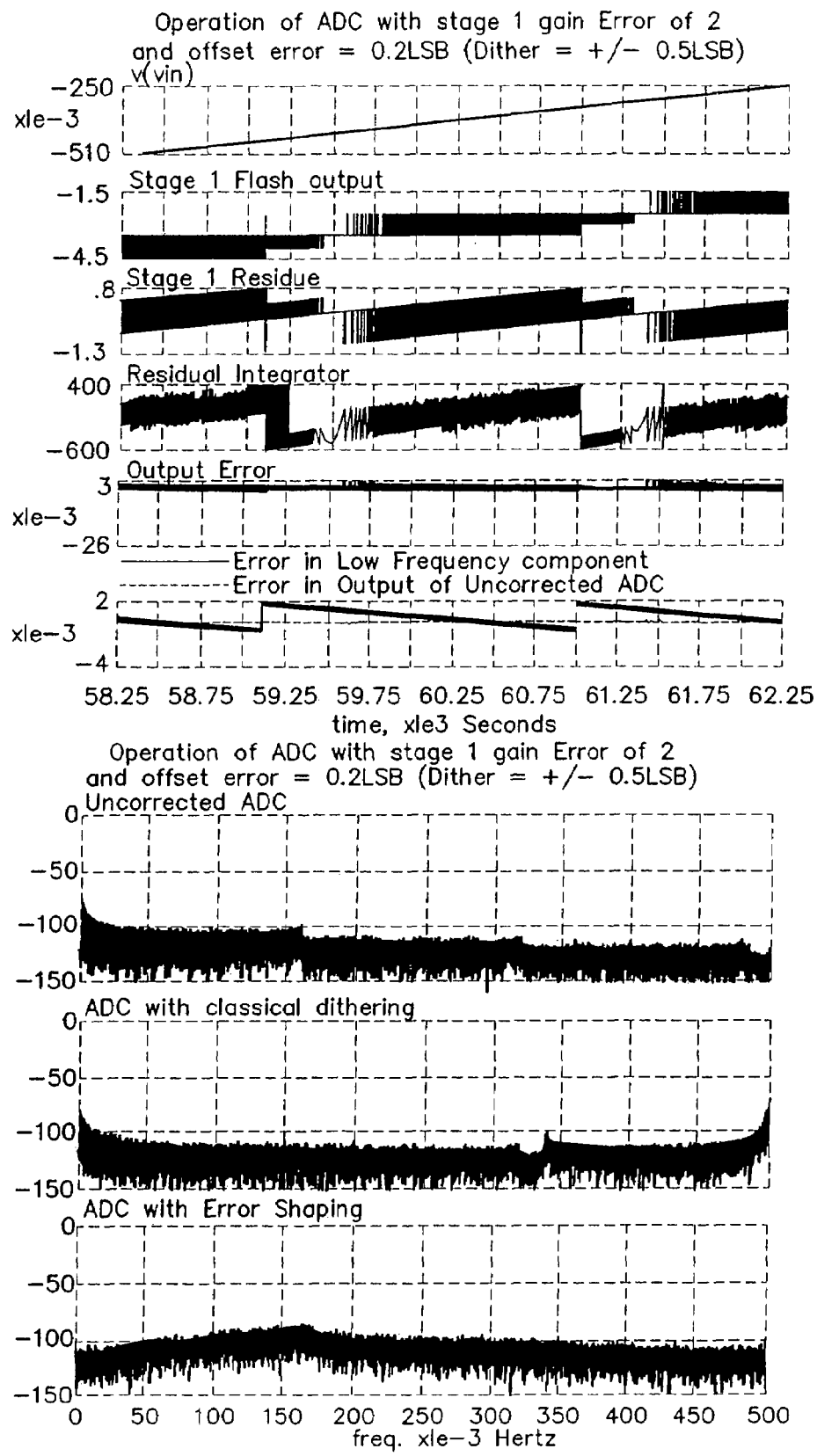
FIG. 17 shows the operation of the ADC with stage 1 gain error of 2 and the offset error with extra comparators added.

The preferred method to deal with this problem therefore is to add extra comparators to the stage 2 input stage to result in the desired first order noise shape characteristic. This is achieved by adding extra comparators to the stage 2 flash and corresponding circuitry in the stage 2 MDAC to accommodate those errors. The effect of the addition of comparators is shown in FIGS. 16 and 17. This extends the input range of stage 2 without interfering with the interstage redundancy. It will be appreciated that additional comparators in addition to the comparators required for processing of signal can equally be provided at each converter stage, the comparators providing two times interstage redundancy, in order to provide additional signal range to accommodate the sigma delta activity in the previous stage.

Figure 18:
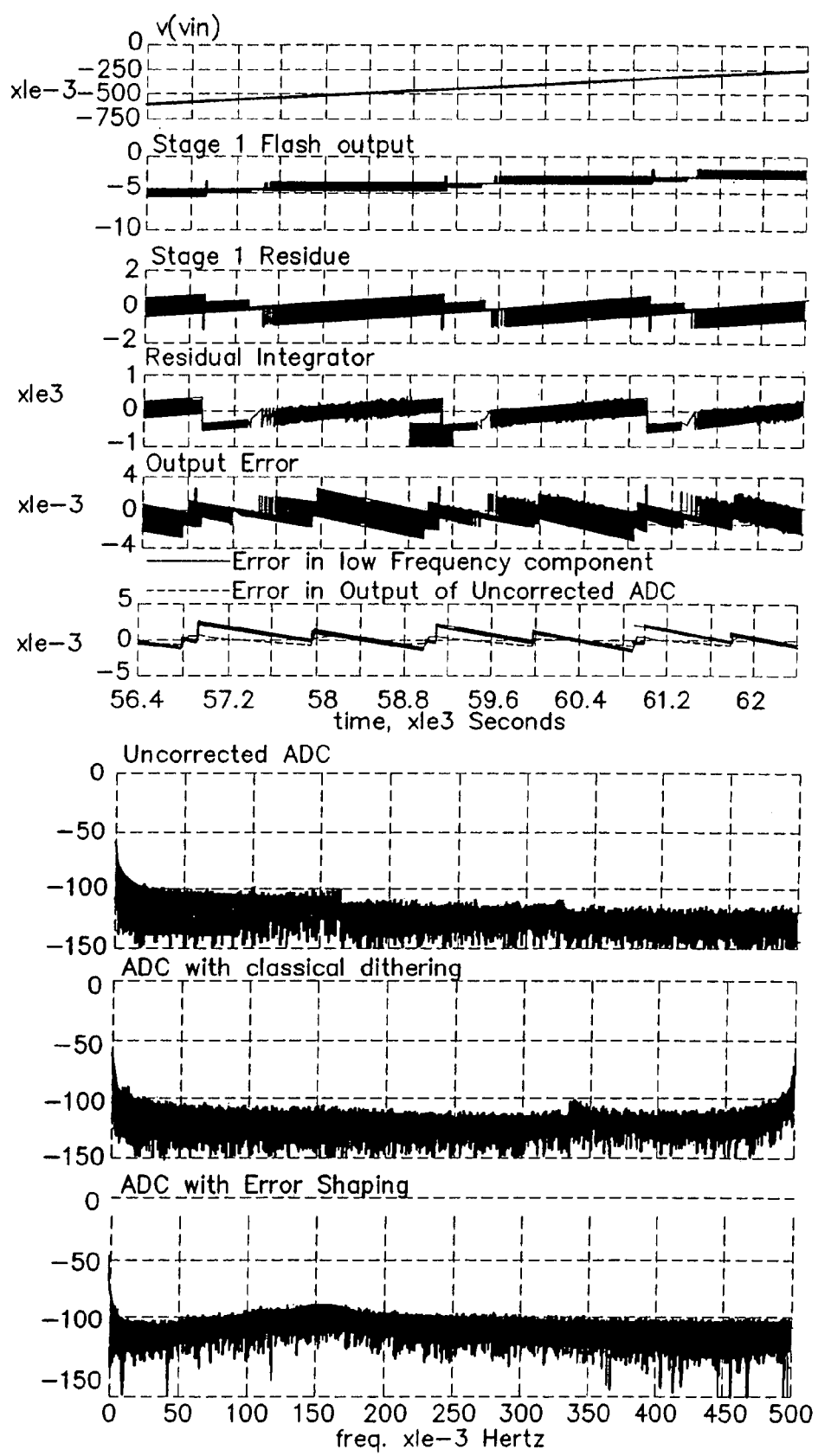
FIG. 18 shows plots of the second embodiment of the invention with a stage 2 gain error of 2% simulated in addition to the stage 1 gain error.

The above described scheme handles stage 1 gain and offset errors satisfactorily. However from an examination of FIG. 18, it can been seen that stage 2 gain errors still impact on performance significantly, although not by as much as stage 1 gain errors. The plots of FIG. 18 are similar to FIG. 13, but with a stage 2 gain error of 2% simulated in addition to the stage 1 gain error. It can be seen however from the

| | Integrator Output | | | | | |
| --- | --- | --- | --- | --- | --- | --- |
| | <−2X | <−X | <0 | >0 | >X | >2X |
| Scheme 1 | −0.5 LSB | −0.5 LSB | −0.5 LSB | +0.5 LSB | +0.5 LSB | +0.5 LSB |
| Scheme 2 | −1 LSB | −1 LSB | −1 LSB | +1 LSB | +1 LSB | +1 LSB |
| Scheme 3 | −1 LSB | −0.5 LSB | −0 LSB | +0 LSB | +0.5 LSB | +1 LSB |
| Scheme 4 | −1 LSB | −0.5 LSB | −0.5 LSB | +0.5 LSB | +0.5 LSB | +1 LSB | bottom plot of the right hand pane that the noise floor is not insignificant at low frequencies, which is undesirable.

This error can be dealt with by the provision of a $2^{nd}$ sigma-delta modulator in stage 2. The implementation of this scheme is very similar to that of scheme 4 of stage 1 in the table above. However, due to the position in the pipe, it should be noted that X is 128 and not 256, as was the case for stage 1.

Figure 19:
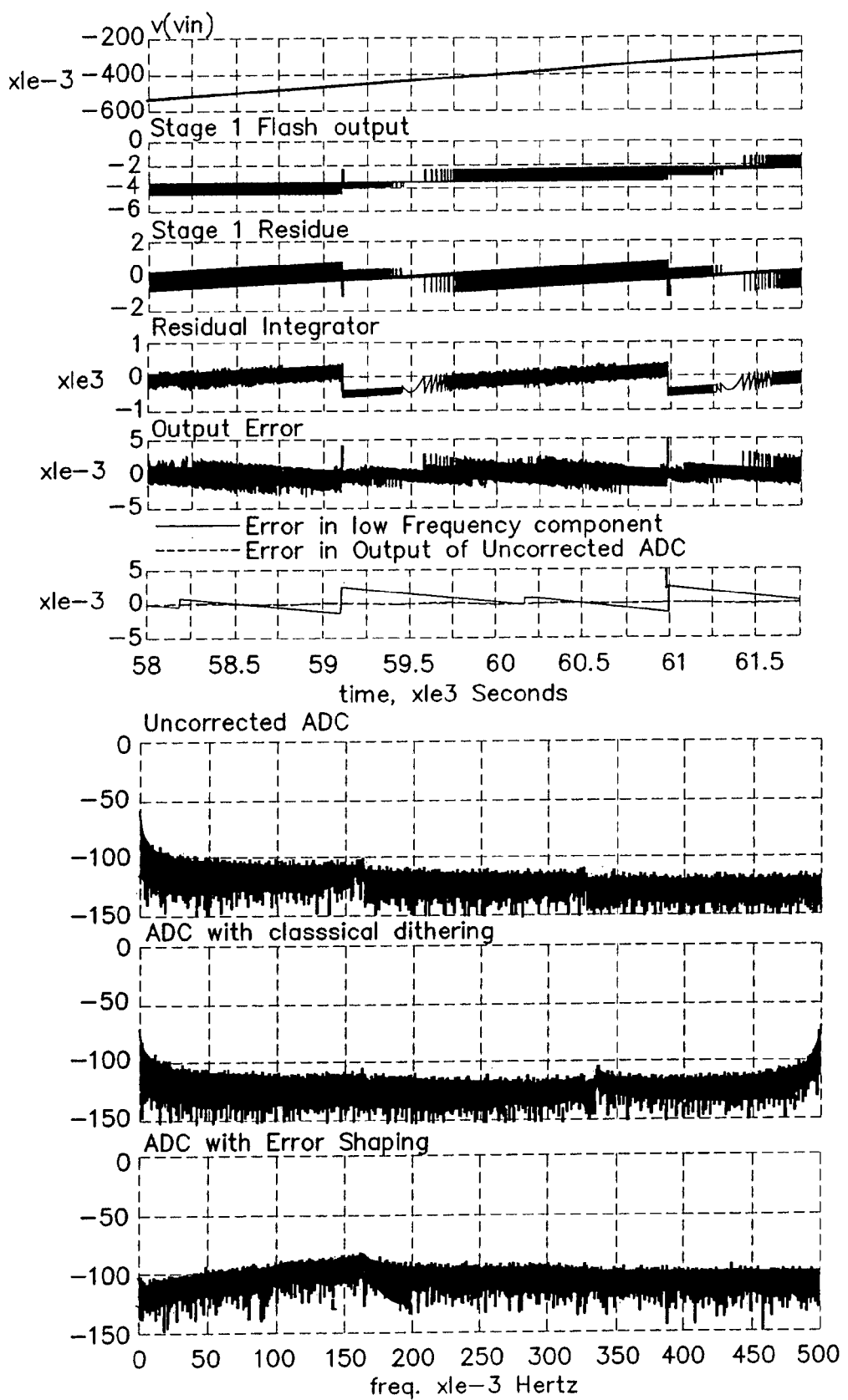
FIG. 19 shows plots of the output of the implementation of the circuit of the second embodiment present invention when the stage 2 correction scheme is running in tandem with the stage 1 correction.

FIG. 19 shows the output of the implementation of the circuit of the second embodiment present invention when the stage 2 correction scheme is running in tandem with the stage 1 correction. The output is for a circuit implementation which includes extra comparators in stage 3 similar to those in stage 2.

It will be appreciated from examination of this figure that with error shaping, the nominal stage 1 output is 1V, with occasional excursions to 1.25V, which occurs for a couple of clock cycles after a major code transition. Although the implementation of the circuit of the second embodiment of the invention provides that the stage 2 correction scheme runs in tandem with the stage 1 correction and results in stage 2 of the ADC being able to successfully process these higher inputs, it is necessary to ensure that the stage 1 MDAC amplifier has the required headroom and the stage 2 flash comparators are suitable.

Figure 20:
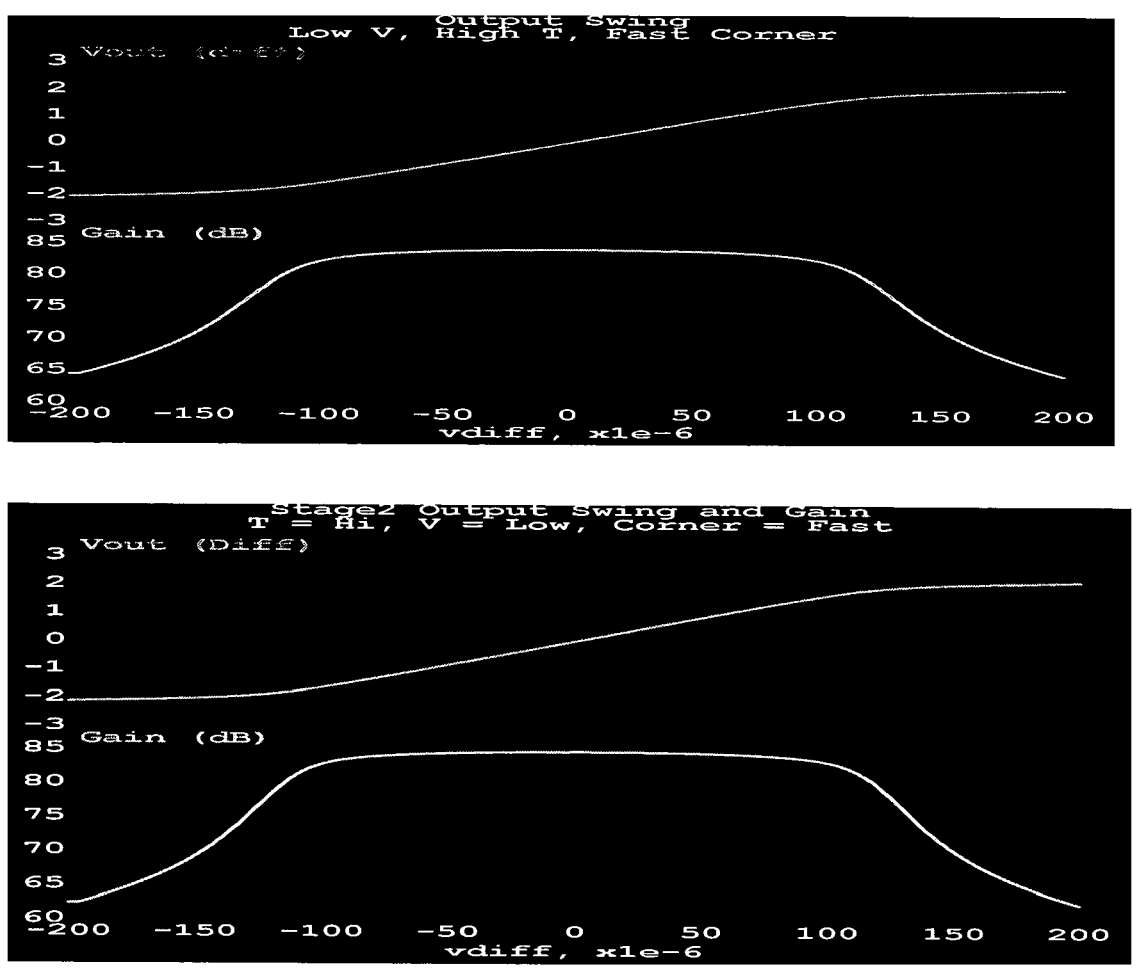
FIG. 20 details the worst case simulation for an ADC of the second embodiment of the invention.

For example, for correct operation of an ADC having reference levels of 1.2V, the output swing should be 1.2V with a reasonable gain remaining at 1.5V. The worst case simulation for such an ADC is shown in FIG. 20, where it can be seen that the amplifiers in stage 1 and stage 2 operate as required.

An alternative solution would be to evaluate the ADC with reduced reference levels.

A number of methods could be used in accordance with the second embodiment present invention to add or subtract 0.5LSB to the flash output. One method involves halving the size of the current unit capacitor. Two of these capacitors can then be used to represent an LSB in the MDAC operation, as illustrated in FIG. 21.

An alternative method involves non complementary reference switching. Currently in the MDAC the reference switching is complementary. This means that each capacitor connected to the amplifier positive terminal, refp, gets switched to the complement of the reference switched to the equivalent capacitor connected to the negative terminal, refn. The 0.5LSBs may be added to the analog output by switching refp to one of the capacitors, but to switch the common mode reference, refcm, rather than refn to the complementary capacitor. It should be noted that this requires that refcm be very close to the midpoint of refp and refn.

An alternative method involves the subtraction of 0.5LSB from the flash decision levels. This is not quite the same as the method of carrying it out digitally, as was the case for the first two methods, since this moves the MDAC characteristic horizontally as well as vertically. However, the overall effect is the same. It will be appreciated that this requires an extra set of sampling switches at the flash inputs.

One further source of error in the pipeline ADC of the present invention is the presence of offset errors in the comparators of the flash ADCs, which comprise half of each pipeline stage. Typically, such comparator offset errors are reduced by designing these comparators so that the offset error is small enough to ensure that errors are accommodated by the interstage redundancy of the ADC. The circuit of the second embodiment of the present invention provides an alternative method of correcting the comparator offset errors. The comparator offset errors are monitored in the digital domain. This is achieved by monitoring the codes coming from the first stage in combination with the codes coming from the residual ADC (i.e. the ADC formed by all subsequent stages). The digital circuitry then makes a determination of the offset error of each comparator and controls that error to keep it close to zero.

The complete block diagram for the ADC of the second embodiment of the present invention with stage 1 and stage 2 error correction is shown in FIG. 22.

The embodiments in the invention described with reference to the drawings comprise a computer apparatus and/or processes performed in a computer apparatus or an integrated circuit. However, the invention also extends to computer programs, particularly computer programs stored on or in a carrier adapted to bring the invention into practice, for example on an integrated circuit. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

The invention is not limited to the embodiments described herein, which may be modified or varied without departing from the scope of the invention.

The invention claimed is:

1. A method for optimizing the output of a pipeline Analog to Digital Converter to reduce integral non-linearity errors, the method comprising:
   adding an analog dither signal to an analog input signal and forming a dithered analog input signal to a pipeline Analog to Digital Converter, and
   converting the dithered analog input signal to a digital output signal by means of the pipeline Analog to Digital Converter,
   wherein the amplitude of the analog dither signal is selected in correspondence to the bit architecture of the Analog to Digital Converter so as to make non-linearity errors substantially equal and opposite on successive cycles of a conversion clock.

2. The method as claimed in claim 1 further comprising the step of subtracting the digital equivalent of the added analog dither signal from the digital output signal.

3. The method as claimed in claim 1, wherein the amplitude of the analog dither signal is near or equal to the full scale value of the Analog to Digital Converter divided by $2^{n+1}$, where n is equal to the number of bits in the first stage of the Analog to Digital Converter.

4. The method as claimed in claim 1, wherein the analog dither signal has a frequency of about half of the sampling frequency.

5. The method as claimed in claim 4, wherein the Analog to Digital Converter has a 4 bit first stage and the dither signal has an amplitude of about 1/32 times the full scale of the Analog to Digital Converter which is added to the analog input on alternate clock cycles.

6. The method as claimed in claim 4, wherein the Analog to Digital Converter has a 4 bit first stage and the dither signal has a amplitude of 1/64 times the full scale of the Analog to Digital Converter, wherein the dither signal is added on a first clock cycle and the dither signal is subtracted on the consecutive clock cycle.

7. The method as claimed in claim 1, wherein the dither signal is substantially a square wave.

8. The method as claimed in claim 1, wherein the dither signal is produced by means of a switched capacitor Sample and Hold Amplifier.

9. A circuit for optimizing the output of a pipeline Analog to Digital Converter to reduce integral non-linearity errors, comprising:
   a pipeline Analog to Digital Converter for converting an analog input signal to a digital output signal; and
   an analog dither signal adder circuit which adds a dither signal to an analog input signal and provides a dithered analog input signal to a pipeline Analog to Digital Converter;
   wherein the amplitude of the analog dither signal is selected in correspondence to the bit architecture of the Analog to Digital Converter so as to make non-linearity errors substantially equal and opposite on successive cycles of a conversion clock.

10. The circuit as claimed in claim 9 further comprising a means for subtracting the digital equivalent of the added analog dither signal from the digital output signal.

11. The circuit as claimed in claim 9, wherein the amplitude of the analog dither signal is near or equal to the full scale value of the Analog to Digital Converter divided by $2^{n+1}$, where n is equal to the number of bits in the first stage of the Analog to Digital Converter.

12. The circuit as claimed in claim 9, wherein the analog dither signal has a frequency of about half of the sampling frequency.

13. The circuit as claimed in claim 12, wherein the Analog to Digital Converter has a 4 bit first stage and the dither signal has an amplitude of about 1/32 times the full scale of the Analog to Digital Converter which is added to the analog input on alternate clock cycles.

14. The circuit as claimed in claim 12, wherein the Analog to Digital Converter has a 4 bit first stage and the dither signal has a amplitude of 1/64 times the full scale of the Analog to Digital Converter, wherein the dither signal is added on a first clock cycle and the dither signal is subtracted on the consecutive clock cycle.

15. The circuit as claimed in claim 9, wherein the dither signal is substantially a square wave.

16. The circuit as claimed in claim 9, wherein the dither signal is produced by means of a switched capacitor Sample and Hold Amplifier.

17. A circuit for optimizing the output of a pipeline Analog to Digital Converter to reduce integral non-linearity errors, the circuit comprising:
   a processor which adds an analog dither signal to an analog input signal to supply a dithered analog input signal to a pipeline Analog to Digital Converter; and
   a pipeline Analog to Digital Converter which converts the dithered analog input signal to a digital output signal, wherein the amplitude of the analog dither signal is selected in correspondence to the bit architecture of the Analog to Digital Converter so as to make non-linearity errors substantially equal and opposite on successive cycles of a conversion clock.

18. A digital signal resulting from the method for optimizing the output of a pipeline Analog to Digital Converter to reduce integral non-linearity errors, the method comprising:
   adding an analog dither signal to the analog input signal of a pipeline Analog to Digital Converter; and
   converting the dithered analog input signal to a digital output signal by means of the pipeline Analog to Digital Converter, wherein the amplitude of the analog dither signal is selected in correspondence to the bit architecture of the Analog to Digital Converter so as to make non-linearity errors substantially equal and opposite on successive cycles of a conversion clock.

19. A method for optimizing the output of a pipeline Analog to Digital Converter to reduce integral non-linearity errors, comprising:
   adding an analog dither signal to an analog input signal to provide a dithered analog input signal to a pipeline Analog to Digital Converter;
   converting the dithered analog input signal to a digital output signal by means of the pipeline Analog to Digital Converter; and
   subtracting the digital equivalent of the added analog dither signal from the digital output signal to provide an optimized digital output signal, wherein the amplitude of the analog dither signal is selected in correspondence to the bit architecture of the Analog to Digital Converter so as to make non-linearity errors substantially equal and opposite on successive cycles of a conversion clock.

20. A circuit for optimizing the output of a pipeline Analog to Digital Converter to reduce integral non-linearity errors, the circuit comprising:
   a processor which adds an analog dither signal to an analog input signal and supplies a dithered analog input signal to a pipeline Analog to Digital Converter; and
   a pipeline Analog to Digital Converter for converting the dithered analog input signal to a digital output signal; and
   a processor for subtracting the digital equivalent of the added analog dither signal from the digital output signal to provide an optimized digital output signal, wherein the amplitude of the analog dither signal is selected in correspondence to the bit architecture of the Analog to Digital Converter so as to make non-linearity errors substantially equal and opposite on successive cycles of a conversion clock.

21. A pipeline analog to digital converter circuit for reducing non-linearity errors, the circuit comprising a pipeline analog to digital converter for converting an analog input signal to a digital output signal and a feedback circuit coupled to the converter such that the digital output signal is adapted to have an average non-linearity error value of about zero.

22. A pipeline analog to digital converter circuit as claimed in claim 21, wherein the feedback circuit comprises a sigma delta modulator.

23. A pipeline analog to digital converter circuit as claimed in claim 22, wherein the sigma delta modulator comprises an integrator and a digital summer.

24. A pipeline analog to digital converter circuit as claimed in claim 23 wherein the pipeline analog to digital converter comprises a plurality of stages, each stage providing two output signals, wherein the first output signal of the first stage is a digital estimate of the input voltage and the second output signal of the first stage is an analog multiple of the error between the digital estimate of the input voltage and the actual value of the input voltage.

25. A pipeline analog to digital converter circuit as claimed in claim 24 wherein the first output signal is generated by a flash analog to digital converter, and the second output signal is the residual output from an MDAC.

26. A pipeline analog to digital converter circuit as claimed in claim 25 wherein the sigma delta modulator integrates the residual output.

27. A pipeline analog to digital converter circuit as claimed in claim 26 wherein the output from the flash analog to digital converter is summed with a dither signal.

28. A pipeline analog to digital converter circuit as claimed in claim 27 wherein the sum of the flash analog to digital converter output and the dither signal is passed to the MDAC.

29. A analog to digital converter circuit as claimed in claim 28 wherein the output of the integrator is used to control the dither signal.

30. A pipeline analog to digital converter circuit as claimed in claim 29 wherein the dither signal is a multiple of the least significant bit of the flash analog to digital converter.

31. A pipeline analog to digital converter circuit as claimed in claim 30 wherein the multiple is negative when the polarity of the integrator output is negative.

32. A pipeline analog to digital converter circuit as claimed in claim 31 wherein the multiple is about 0.5 or −0.5 as determined by the polarity of the integrator output.

33. A pipeline analog to digital converter circuit as claimed in claim 30 wherein the value of the multiple is about −1. −0.5,+0.5 or +1 as determined by the output of the integrator.

34. A pipeline analog to digital converter circuit as claimed in claim 24 wherein the value of the multiple of the error between the digital estimate of the input voltage and the actual value of the input voltage is about eight.

35. A pipeline analog to digital converter circuit as claimed in claim 23 wherein the integrator is a digital integrator.

36. A pipeline analog to digital converter circuit as claimed in claim 25 wherein the stage 2 flash is provided with one or more comparators in addition to the comparators required for processing of signal, the comparators providing about two times interstage redundancy, in order to provide additional signal range to accommodate the sigma delta activity in the previous stage.

37. A pipeline analog to digital converter circuit as claimed in claim 25 further comprising a second sigma-delta modulator in stage 2 of the converter.

38. A pipeline analog to digital converter circuit as claimed in claim 30 wherein the least significant bit is represented by two capacitors.

39. A pipeline analog to digital converter circuit as claimed in claim 25 wherein the MDAC incorporates non complementary reference switching.

40. A pipeline analog to digital converter circuit as claimed in claim 32 wherein the about 0.5 LSB is subtracted in the analog domain.

41. A pipeline analog to digital converter circuit as claimed in claim 21 wherein the converter incorporates offset errors, the errors being monitored and controlled in the digital domain.

42. A method for reducing non-linearity errors in a pipeline analog to digital converter circuit, the method comprising: converting an analog input signal to a digital output signal by means of a pipeline analog to digital converter; and
creating a feedback loop coupled to the converter such that the digital output signal is adapted to have an average non-linearity error value of about zero.

43. A pipeline analog to digital converter circuit for reducing non-linearity errors, the circuit comprising:
an analog-to-digital converter a feedback loop mechanism coupled to the converter such that the digital output signal is adapted to have an average non-linearity error value of about zero.

* * * * *